US012710692B2

(12) United States Patent
Oh et al.

(10) Patent No.: US 12,710,692 B2
(45) Date of Patent: Aug. 18, 2026

(54) OPTICAL PROXIMITY CORRECTION METHOD AND PHOTOMASK FABRICATION METHOD USING THE SAME

(71) Applicant: SAMSUNG ELECTRONICS CO., LTD., Suwon-si (KR)

(72) Inventors: Heungsuk Oh, Suwon-si (KR); Joobyoung Kim, San Jose, CA (US); Sangwook Kim, Suwon-si (KR); Hee-Jun Lee, Suwon-si (KR); Jeeeun Jung, Suwon-si (KR); Kyu-Bin Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 615 days.

(21) Appl. No.: 18/330,729

(22) Filed: Jun. 7, 2023

(65) Prior Publication Data

US 2024/0176227 A1 May 30, 2024

Related U.S. Application Data

(60) Provisional application No. 63/385,221, filed on Nov. 29, 2022.

(30) Foreign Application Priority Data

Jan. 10, 2023 (KR) ........................ 10-2023-0003447

(51) Int. Cl.
*G03F 1/36* (2012.01)
*H10P 14/61* (2026.01)

(52) U.S. Cl.
CPC ................ *G03F 1/36* (2013.01); *H10P 14/61* (2026.01)

(58) Field of Classification Search
CPC ..... G03F 1/36; G03F 1/72; G03F 1/76; G03F 1/80; H10P 14/61; H10D 89/10
USPC ............................................................ 716/53
See application file for complete search history.

(56) References Cited

U.S. PATENT DOCUMENTS 7,000,208 B2 2/2006 Zhang
7,735,053 B2 6/2010 Harazaki
8,473,875 B2 6/2013 Fujimura et al.
8,578,313 B2 11/2013 Tang et al.
(Continued)

FOREIGN PATENT DOCUMENTS

CN 114815494 A 7/2022
KR 10-2019-0003909 A 1/2019
KR 10-2022-0078124 A 6/2022

*Primary Examiner* — Paul Dinh
(74) *Attorney, Agent, or Firm* — Morgan, Lewis & Bockius LLP

(57) ABSTRACT

A photomask fabrication method comprising performing an optical proximity correction (OPC) on a design pattern to generate a correction pattern, and manufacturing the photomask having the correction pattern. The step of performing the OPC includes dividing the design pattern into a plurality of segments, producing a hash value for each of the plurality of segments, and generating the correction pattern by applying a first correction bias to ones of the plurality of segments having a same hash value, wherein at least two of the plurality of segments have the same hash value. The step of producing the hash value includes generating a key segment in a target segment, creating a query region around the key segment, and producing the hash value for the target segment based on a pattern image in the query region.

20 Claims, 36 Drawing Sheets

(56) References Cited

U.S. PATENT DOCUMENTS

| | | | | |
|---|---|---|---|---|
| 8,871,409 | B2 | 10/2014 | Pforr et al. | |
| 9,310,674 | B2 | 4/2016 | Azpiroz et al. | |
| 2006/0190850 | A1* | 8/2006 | Kohle | G03F 1/36<br>716/53 |
| 2008/0250383 | A1 | 10/2008 | Tanaka et al. | |
| 2008/0276215 | A1* | 11/2008 | Higuchi | G03F 1/36<br>716/55 |
| 2020/0142294 | A1 | 5/2020 | Wang et al. | |

* cited by examiner

LIP1
LIP2
LIP3
LIP4
LIP5
ASG
NSG
SEG
NSG
NSG
ASG
TSG1
QR1
D1
D2

LIP1
LIP2
LIP3
LIP4
LIP5
ASG
NSG
SEG
NSG
NSG
ASG
TSG2
QR2
D1
D2

OPTICAL PROXIMITY CORRECTION METHOD AND PHOTOMASK FABRICATION METHOD USING THE SAME

CROSS-REFERENCE TO RELATED APPLICATION

This application claims the benefit of U.S. Provisional Application Ser. No. 63/385,221, filed on Nov. 29, 2022, and priority under 35 U.S.C § 119 to Korean Patent Application No. 10-2023-0003447, filed on Jan. 10, 2023, in the Korean Intellectual Property Office, the disclosures of which are hereby incorporated by reference in their entireties.

TECHNICAL FIELD

Embodiments of the present inventive concepts relate to a method of fabricating a photomask, and more particularly, to a method of manufacturing a photomask, which may be used to fabricate a semiconductor device, using optical proximity correction (OPC).

DISCUSSION OF RELATED ART

Semiconductor devices are typically considered to be essential elements in the electronics industry, at least due to properties such as compactness, multi-functionality, and/or low manufacturing cost. Semiconductor devices may be deployed in a verity of applications. For example, semiconductor memory devices may be used to store logic data or process operations of logic data, and hybrid semiconductor devices may have both memory and logic elements. Semiconductor devices have been increasingly needed for high integration applications as the electronics industry continues to advance. For example, semiconductor devices are increasingly needed for high reliability, high speed, and/or multi-functionality applications. To meet these needs, improvements in semiconductor devices are leading to increasingly complicated and integrated devices.

SUMMARY

Some embodiments of the present inventive concepts provide an optical proximity correction method capable of consistent optical proximity correction.

Some embodiments of the present inventive concepts provide a method of fabricating a semiconductor device with increased integration and improved reliability.

According to some embodiments of the present inventive concepts, a method of fabricating a photomask may comprise: performing an optical proximity correction (OPC) on a design pattern to generate a correction pattern; and manufacturing the photomask having the correction pattern. The step of performing the OPC may include: dividing the design pattern into a plurality of segments; producing a hash value for each of the plurality of segments; and generating the correction pattern by applying a first correction bias to ones of the plurality of segments having a same hash value, wherein at least two of the plurality of segments have the same hash value. The step of producing the hash value may include: generating a key segment in a target segment; creating a query region around the key segment; and producing the hash value for the target segment based on a pattern image in the query region.

According to some embodiments of the present inventive concepts, a method of fabricating a photomask may comprise: performing an optical proximity correction (OPC) on a line-and-space pattern to generate a correction pattern; and manufacturing the photomask having the correction pattern. The step of performing the OPC may include: dividing the line-and-space pattern into a plurality of segments; producing a hash value for each of the plurality of segments; and generating the correction pattern by applying a first correction bias to ones of the plurality of segments having a same hash value, wherein at least two of the plurality of segments have the same hash value. The step of producing the hash value may include producing the same hash value for at least two segments of the plurality of segments that have a same pattern image in a query region.

According to some embodiments of the present inventive concepts, a method of fabricating a semiconductor device may comprise: performing an optical proximity correction (OPC) on a design pattern to generate a correction pattern; using the correction pattern to manufacture a photomask; forming an etch target layer and a photoresist layer on a substrate; using the photomask to expose and develop the photoresist layer to form a plurality of photoresist patterns; and using the photoresist patterns to pattern the etch target layer. The step of performing the OPC may include: dividing the design pattern into a plurality of segments including a normal segment and an abnormal segment that has a length different than a length of the normal segment; creating a first query region of the normal segment; creating a second query region of the abnormal segment, the second query region having a pattern image the same as a pattern image of the first query region; producing a same hash value for the normal segment and the abnormal segment; and generating the correction pattern by applying a same correction bias to the normal segment and the abnormal segment that have the same hash value.

DETAILED DESCRIPTION

Figure 1:
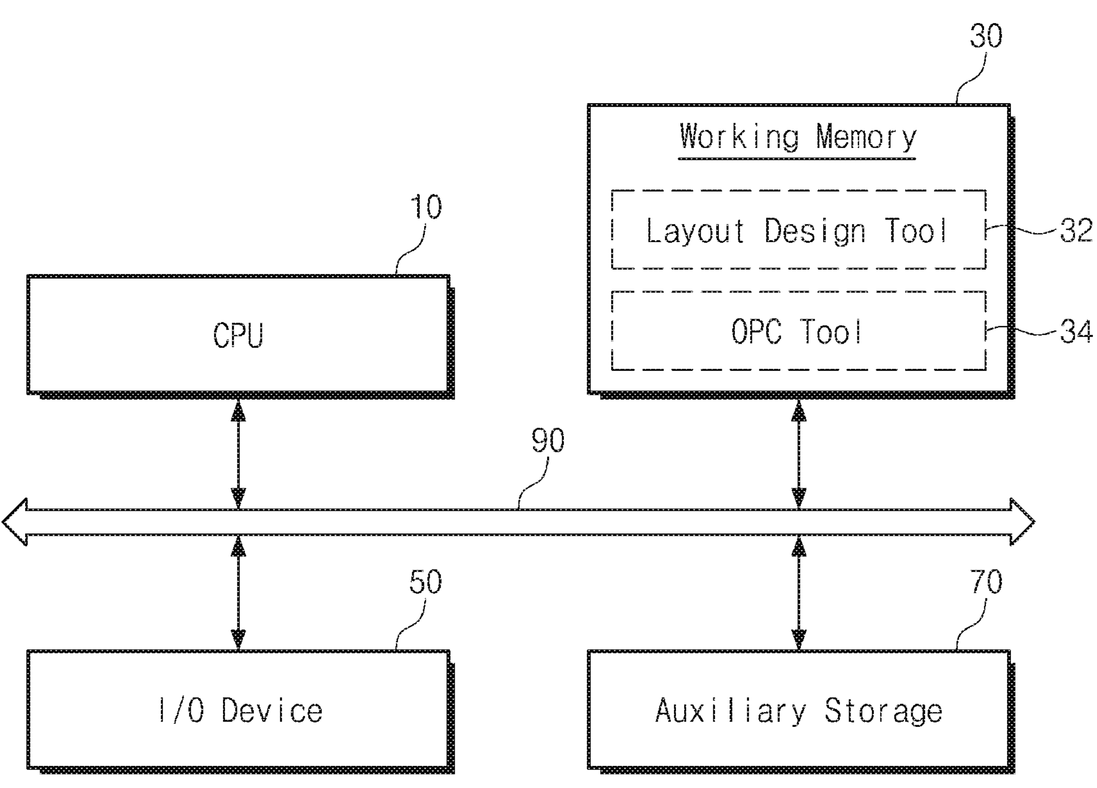
FIG. 1 illustrates a block diagram showing a computer system for performing semiconductor design according to some embodiments of the present inventive concepts.

FIG. 1 illustrates a block diagram showing a computer system for semiconductor design according to some embodiments of the present inventive concepts. Referring to FIG. 1, a computer system may include a central processing unit (CPU) 10, a working memory 30, an input/output (I/O) device 50, and an auxiliary storage 70. The computer system may be a dedicated device for designing a layout. The computer system may be configured to drive various design and verification simulation programs.

The CPU 10 may enable the computer system to execute software (e.g., application programs, an operating system (OS), and device drivers). For example, I CPU 10 may run an operating system loaded in the working memory 30. The operating system (OS) may manage hardware and software of the computer system. The CPU 10 may execute various application programs under the management of the operating system (OS). For example, the CPU 10 may run a layout design tool 32 and/or an optical proximity correction (OPC) tool 34 that are loaded in the working memory 30.

The operating system (OS) or application programs may be loaded in the working memory 30. When the computer system is booted up, based on booting sequence, an operating system image (not shown) stored in the auxiliary storage 70 may be loaded to the working memory 30. Overall input/output operations of the computer system may be managed by the operating system (OS). The working memory 30 may be loaded with the application programs that are selected by a user or needed for a service. The layout design tool 32 and/or the OPC tool 34 may be loaded from the auxiliary storage 70 to the working memory 30.

The layout design tool 32 may include a bias function. The bias function may be used to change shapes and positions of a specific layout pattern using a design rule. In addition, the layout design tool 32 may perform a design rule check (DRC) under a changed bias data condition. The OPC tool 34 may perform optical proximity correction (OPC) on layout data output from the layout design tool 32. The working memory 30 may be, for example, a volatile memory such as static random access memory (SRAM) and dynamic random access memory (DRAM), or a nonvolatile memory such as phase change random access memory (PRAM), magnetic random access memory (MRAM), resistance random access memory (ReRAM), ferroelectric random access memory (FRAM), and NOR Flash memory.

The input/output device 50 may control user input/output operations, such as those facilitated by a user interface. For example, the input/output device 50 may include a keyboard or a monitor, which may enable a designer to exchange relevant information with the computer system. The user may use the input/output device 50 to receive information about a semiconductor region or data paths for which operating characteristics may be adjusted. The input/output device 50 may display a progress status or a process result of the OPC tool 34.

The auxiliary storage 70 may serve as a storage medium for the computer system. The auxiliary storage 70 may store the application programs, the operating system image, and data. The auxiliary storage 70 may be provided in the form a memory card (e.g., MMC, eMMC, SD, and Micro SD), a hard disk drive (HDD), or a combination thereof. The auxiliary storage 70 may include a NAND Flash memory having a large memory capacity. In some embodiments, the auxiliary storage 70 may include a NOR Flash memory or a next-generation volatile memory such as PRAM, MRAM, ReRAM, and FRAM.

A system interconnector 90 may be provided. The system interconnector 90 may serve as a system bus for providing a network in the computer system. The CPU 10, the working memory 30, the input/output device 50, and the auxiliary storage 70 may be electrically connected through the system interconnector 90 and may exchange data with each other through the system interconnector 90. The system interconnector 90 is not limited to the above description and may further include intermediary connections, for example, for efficient management.

Figure 2:
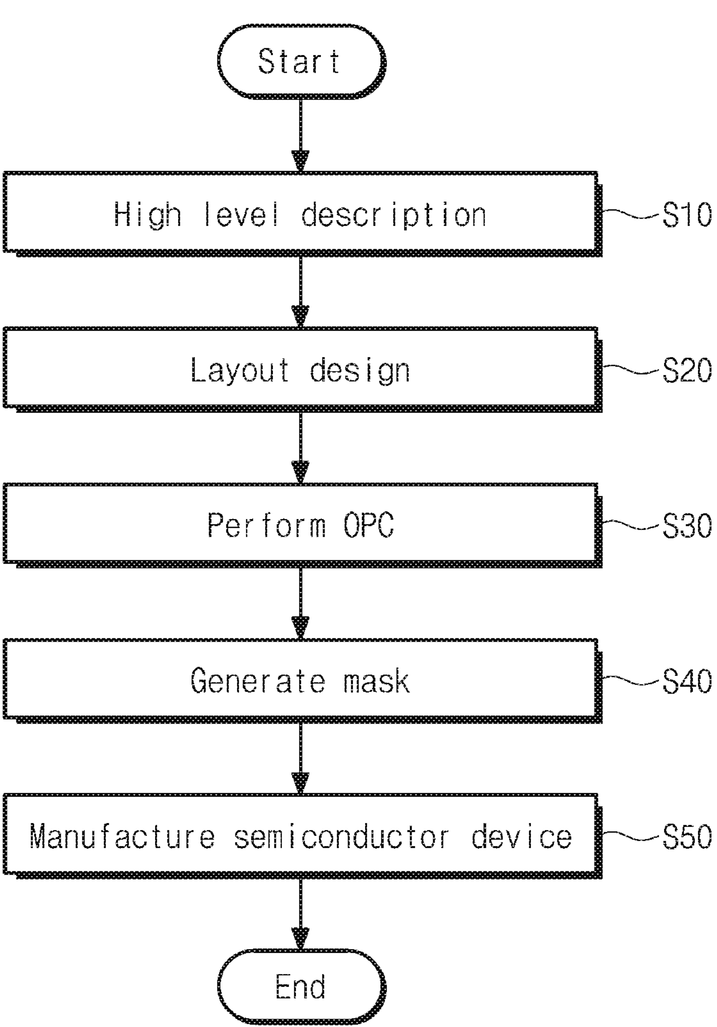
FIG. 2 illustrates a flowchart showing a method of designing and fabricating a semiconductor device according to some embodiments of the present inventive concepts.

FIG. 2 illustrates a flowchart showing a method of designing and fabricating a semiconductor device according to some embodiments of the present inventive concepts.

Referring to FIG. 2, a high-level design of a semiconductor integrated circuit may be generated using the computer system discussed with reference to FIG. 1 (S10). The high-level design may be an integrated circuit corresponding to a design target described with a high-level language of a hardware description language. For example, the high-level language, such as the C programming language, may be used for the high-level design. A register transfer level (RTL) coding or simulation may be used to express, in detail, circuits described by the high-level design. In addition, codes created by the resist transfer level coding may be converted into a netlist, and the netlist may be synthesized to describe an entire semiconductor device. The synthesized schematic circuit may be verified by a simulation tool and an adjustment process may be performed based on a verified result of the simulation tool.

A layout design may be generated using the high-level design (S20). The layout design may be used to implement a semiconductor integrated circuit that is logically complete on a silicon substrate. For example, the layout design step may be performed based on the schematic circuit synthesized in the high-level design step or the netlist corresponding to the schematic circuit. The layout design step may include a routing step that places and connects various standard cells based on a prescribed design rule. The standard cells may be provided from a cell library, for example.

The cell library for the layout design may include information about operation, speed, and power consumption of the standard cells. The cell library for representing a layout of a specific gate-level circuit may be defined in the layout design tool. The layout may be prepared to define shapes or dimensions of patterns constituting transistors and metal lines that may be formed on a silicon substrate. For example, to form an inverter circuit on a silicon substrate, layout patterns may be appropriately placed or described on the silicon substrate. The layout patterns of the inverter circuit may correspond to features such as PMOS devices, NMOS devices, N-wells, gate electrodes, and metal lines. In some examples, a search may be first performed to select a suitable inverter, which may be predefined in the cell library.

Thereafter, a routing step for connecting the selected and provided standard cells may be performed. Specifically, the routing step may be performed to connect the selected and placed standard cells to associated lines, for example, overlying lines. The standard cells may be well-designed for connection to each other through the routing step. For example, the standard cells may have a fixed height.

A series of these placing and routing steps may be automatically or manually performed in the layout design tool. The placing and routing steps may be automatically performed by a Place & Routing tool.

A verification step may be performed on the layout to check whether any portion of the schematic circuit violates a given design rule. The verification step may include a design rule check (DRC) for verifying whether the layout meets the given design rule, an electrical rule check (ERC) for verifying whether there is an issue of an electrical disconnection in the layout, and a layout vs. schematic (LVS) verification for verifying whether the layout agrees with the gate-level netlist.

An optical proximity correction (OPC) step may be performed (S30) following the generation of the layout design. A photolithography process may be employed to fabricate the devices corresponding to the layout patterns of the layout design on a silicon substrate. The optical proximity correction process may be a technique for correcting an unintended optical effect that may occur in the photolithography process. For example, the optical proximity correction process may correct an undesirable phenomenon, such as refraction or process side effects caused by characteristics of light in an exposure process using the layout patterns. When the optical proximity correction step is performed, shapes and positions of the layout patterns may be biased (or changed), generating biased layout. The optical proximity correction step will be further discussed in detail with reference to FIGS. 3 to 8.

A photomask may be generated based on the biased layout generated by the optical proximity correction step (S40). The photomask may generally be manufactured according to the layout patterns using a chromium layer coated on a glass substrate.

The photomask may be used to manufacture a semiconductor device (S50). Various exposure and etching processes may be repeatedly performed in manufacturing of the semiconductor device using the photomask. Through the processes described herein, layout patterns defined in the layout design may be sequentially formed on a silicon substrate.

Figure 3:
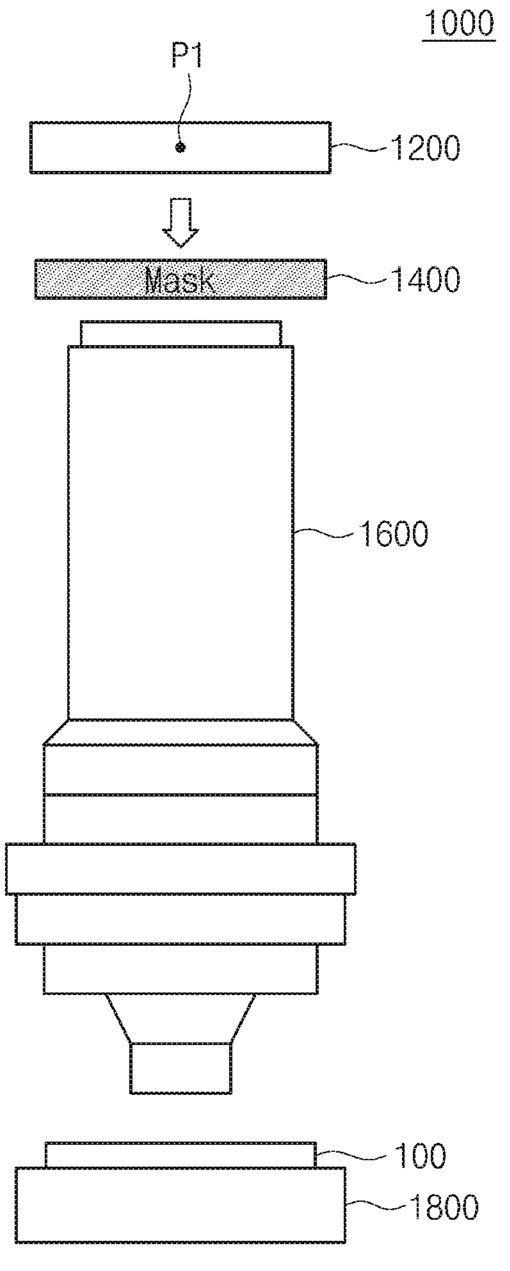
FIG. 3 illustrates a conceptual diagram showing a photolithography system using a photomask manufactured according to some embodiments of the present inventive concepts.

FIG. 3 illustrates a conceptual diagram showing a photolithography system that uses a photomask manufactured according to some embodiments of the present inventive concepts. The photolithography system 1000 may include a light source 1200, a photomask 1400, a reduction projection apparatus 1600, and a substrate stage 1800. The photolithography system 1000 may further include components that are not shown in FIG. 3. For example, the photolithography system 1000 may further include a sensor used for measuring height and slope of a surface of a substrate 100.

The light source 1200 may emit light. The light emitted by the light source 1200 may travel toward the photomask 1400. For example, a sensor may be provided between the light source 1200 and the photomask 1400 to adjust a focus of the light. The light source 1200 may include an ultraviolet light source (e.g., KrF light source with wavelength of about 234 nm, ArF light source with wavelength of about 193 nm) or an extreme ultraviolet (EUV) light source. For example, an extreme ultraviolet (EUV) light source may be adopted as the light source 1200 according to some embodiments of the present inventive concepts. The light source 1200 may include a single point light source P1, but the present inventive concepts are not limited thereto. In some embodiments, the light source 1200 may include a plurality of point light sources.

The photomask 1400 may include image patterns to print (implement) a designed layout on the substrate 100. The image patterns may be formed using the layout patterns obtained from the layout design (S20) and the optical proximity correction (S30). The image patterns may be defined by a transparent region and an opaque region. The transparent region may be formed by, for example, etching a metal layer (e.g., a chromium layer) on the photomask 1400. The transparent region may be transparent to the light emitted by the light source 1200. The opaque region may not allow the light to pass through the photomask 1400 and may block the light.

The reduction projection apparatus 1600 may receive light that passes through the photomask 1400. The reduction projection apparatus 1600 may print layout patterns on the substrate 100 using the image patterns of the photomask 1400. The substrate 100 may be irradiated with the light that passes through the reduction projection apparatus 1600. Therefore, patterns that correspond to the image patterns may be printed on the substrate 100 using the photomask 1400.

The substrate stage 1800 may support the substrate 100. For example, the substrate 100 may be a silicon wafer. The reduction projection apparatus 1600 may include an aperture. The aperture may be used to raise a depth of focus of an ultraviolet ray emitted by the light source 1200. For example, the aperture may include a dipole aperture or a quadruple aperture. The reduction projection apparatus 1600 may further include a lens to adjust a focus of the light.

As the integration of semiconductor devices increases, relatively distance between the image patterns of the photomask 1400 may decrease. Such "proximity" may cause interference and diffraction of the light, and a distorted pattern may be printed on the substrate 100. When distorted patterns are printed on the substrate 100, designed and fabricated circuits may abnormally operate.

A resolution enhancement technology may be used to correct for a pattern distortion. Optical proximity correction (see S30 of FIG. 2) may be an example of the resolution enhancement technology. According to the optical proximity correction, it may be possible to predict a degree of distortion such as interference and diffraction of light. Based on the predicted degree of distortion, a designed layout may be biased (changed). Based on the biased layout, image patterns may be formed on the photomask 1400, and desired patterns may be printed on the substrate 100, wherein the distortion is reduced or eliminated.

A layout of a semiconductor device may include a plurality of layers. For example, the optical proximity correction may be performed to adjust a layout of a single layer. The optical proximity correction may be independently performed on each of the plurality of layers. The plurality of layers may be sequentially implemented through semiconductor processes to form a semiconductor device on a substrate. For example, a semiconductor device may include a plurality of stacked metal layers to achieve a specific circuit.

Figure 4:
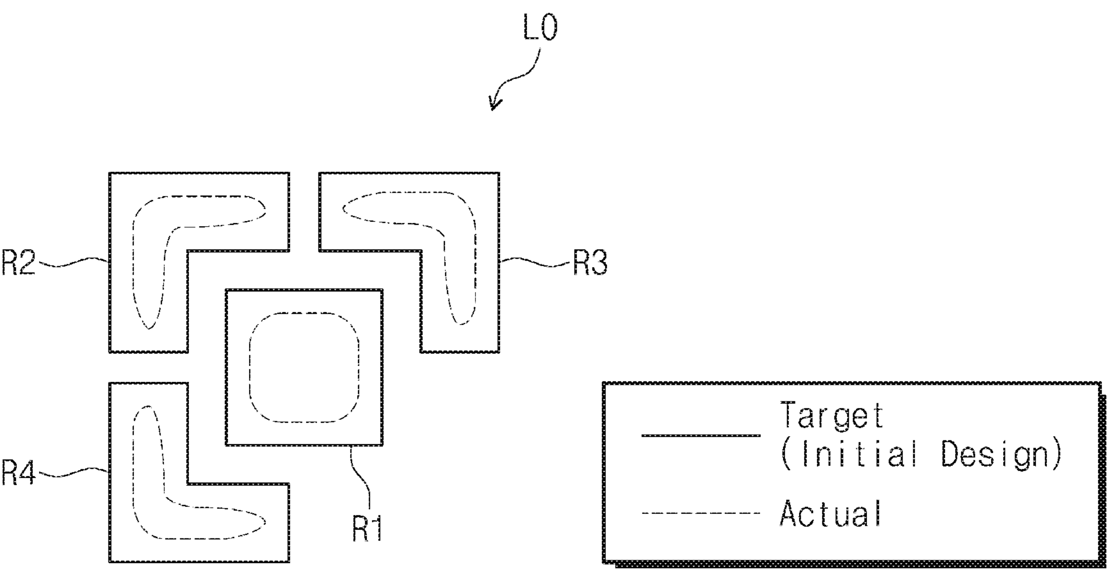
FIG. 4 illustrates a conceptual diagram showing a layout according to some embodiments of the present inventive concepts.

FIG. 4 illustrates a conceptual diagram showing a layout according to some embodiments of the present inventive concepts. In FIG. 4, a solid line may indicate target patterns which are intended to be printed on the substrate 100 of FIG. 3 and a dotted line may denote actual patterns that are actually printed on the substrate 100 of FIG. 3.

A designed layout LO may include first circuit patterns R1, second circuit patterns R2, third circuit patterns R3, and fourth circuit patterns R4. A shape of the designed layout LO shown in FIG. 4 may be an example to facilitate an understanding of the present inventive concepts, but embodiments of the present inventive concepts are not limited thereto. The designed layout LO may be provided as an initially designed layout. Solid lines of the first circuit pattern R1, the second circuit pattern R2, the third circuit pattern R3, and the fourth circuit pattern R4 shown in FIG. 4 may signify target patterns to be printed on the substrate 100.

As discussed above, an implementation of patterns on the substrate 100 may induce distortion such as interference and diffraction of light. When the image patterns of the photomask 1400 are formed based on the solid lines shown in FIG. 4, the first circuit pattern R1, the second circuit pattern R2, the third circuit pattern R3, and the fourth circuit pattern R4 that are printed on the substrate 100 have a pattern shape designated by the dotted line of FIG. 4. When distorted patterns indicated by the dotted lines of FIG. 4 are formed on the substrate 100, the designed circuits may abnormally operate.

Optical proximity correction may be performed to correct for a pattern distortion. The designed layout LO designed through the optical proximity correction may be biased (changed) to reduce a difference between a practical pattern (dotted line of FIG. 4) and a target pattern (solid line of FIG. 4). Image patterns of the photomask 1400 may be formed based on a biased layout. When the photomask 1400 is used to perform a photolithography process, patterns printed on the substrate 100 may have substantially the same shapes as those of the first circuit pattern R1, the second circuit pattern R2, the third circuit pattern R3, and fourth circuit pattern R4 of the designed layout LO.

Figure 5:
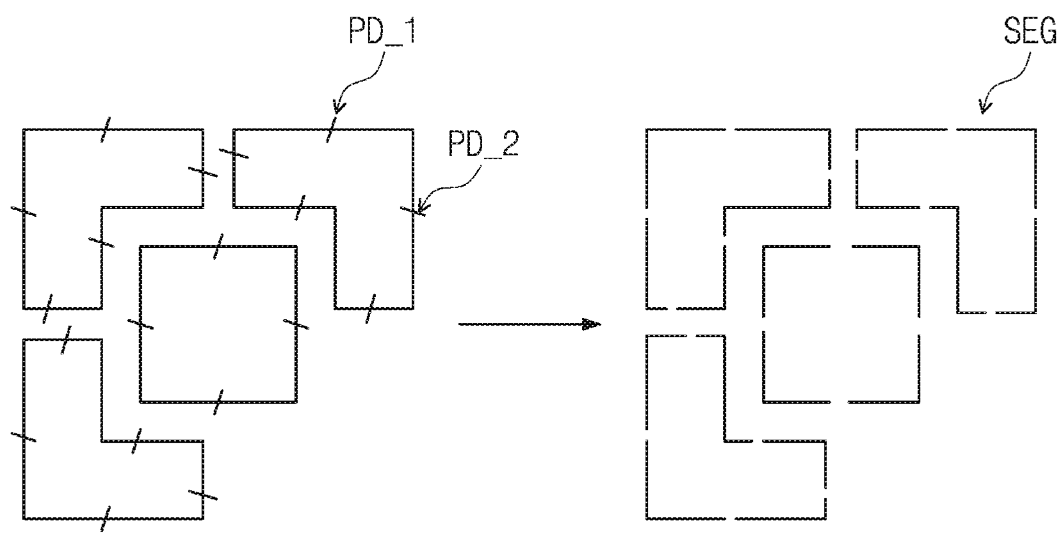
FIG. 5 illustrates a conceptual diagram showing an optical proximity correction procedure in which a contour of the layout designed in FIG. 4 is divided into a plurality of segments.

FIG. 5 illustrates a conceptual diagram showing a procedure in which a contour of the designed layout depicted in FIG. 4 is divided into a plurality of segments in an optical proximity correction step. Referring to FIG. 5, a plurality of division points may be provided on a contour of a designed layout. For example, a first division point PD_1 and a second division point PD_2 may be set on the contour of the designed layout. A single segment SEG may be obtained based on the first division point PD_1 and second division point PD_2. Similarly, based on a plurality of division points, the contour of the designed layout may be divided into a plurality of segments.

In this description, the term "division" may not mean physical division. For example, FIG. 5 depicts that a plurality of segments are physically divided from each other, but this is conceptually provided to aid understanding.

Figure 6:
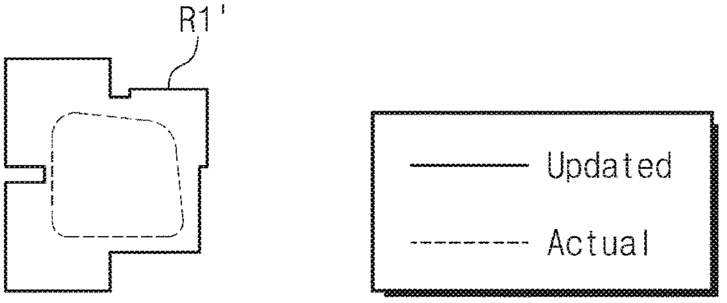
FIG. 6 illustrates a conceptual diagram showing a layout corrected by the optical proximity correction of FIG. 5.

In the optical proximity correction, each of the divided segments, e.g., segment SEG. may become a target for bias. Each of the divided segments may be biased independently of each other. For example, independently of other segments, the segment SEG may be biased along one of a first direction (e.g., a positive or outward direction) and a second direction (e.g., a negative or inward direction). Each of the divided segments may be biased to reduce a difference between a target pattern and an actual pattern that is implemented on the substrate 100. The OPC tool 34 of FIG. 1 may be employed to bias the divided segments. FIG. 6 shows an example of an updated layout obtained based on the biased segments.

FIG. 6 illustrates a conceptual diagram showing a layout corrected by the optical proximity correction of FIG. 5 according to some embodiments of the present inventive concepts. Referring to FIG. 6, an updated first correction pattern R1' may be generated. The updated first correction pattern may be biased from the first circuit pattern R1 of FIG. 4. An explanation about the second circuit patterns R2, the third circuit patterns R4, and the fourth circuit pattern R4 of FIG. 4 will be omitted for convenience of description. As discussed above with reference to FIG. 5, the contour of the first circuit pattern R1 of FIG. 4 may be divided into a plurality of segments, and each of the plurality of divided segments may be biased. As shown in FIG. 6, each segment may be biased along one of the first direction (e.g., the positive or outward direction) and the second direction (e.g., the negative or inward direction). In this case, one or more segments may not be biased. Therefore, the first correction pattern R1' may be obtained.

In FIG. 6, a dotted line may indicate an actual pattern which will be practically printed through a biased layout on the substrate 100 of FIG. 3. When each of divided segments is biased, it may be possible to reduce a difference between an actual pattern and a target pattern.

Figure 7:
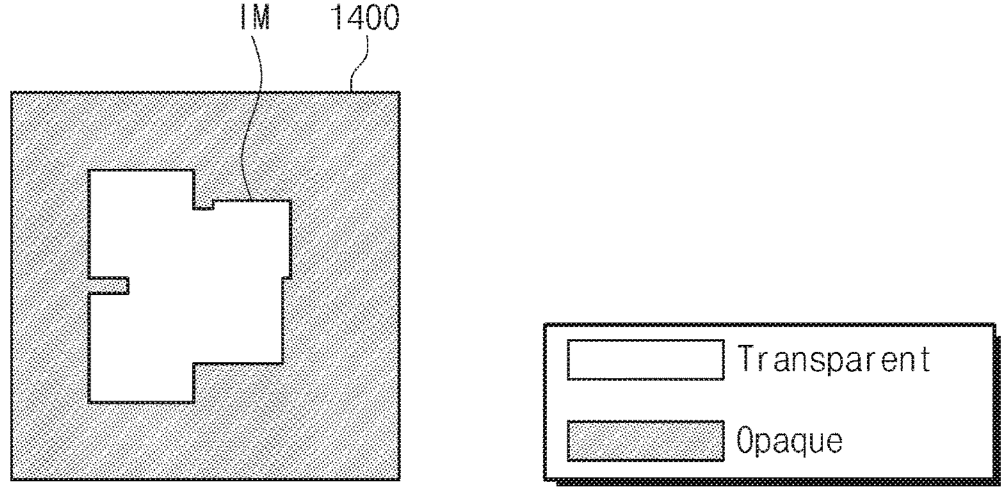
FIG. 7 illustrates a conceptual diagram showing a photomask manufactured based on the layout of FIG. 6.

FIG. 7 illustrates a conceptual diagram showing a photomask manufactured using the biased layout of FIG. 6 according to some embodiments of the present inventive concepts. A mask data may be produced after a mask rule check (MRC) step performed on the biased layout of FIG. 6. A photomask may be manufactured based on the mask data.

For example, referring to FIG. 7, the photomask 1400 may include an image pattern IM that corresponds to the first correction pattern R1' of FIG. 6. The photomask 1400 may include a transparent region and an opaque region. The opaque region may not allow light to pass through the photomask 1400 and may block the light. The transparent region of the photomask 1400 may be transparent to the light emitted by the light source 1200. The substrate 100 of FIG. 3 may receive the light that passes through the photomask 1400. For example, when a photolithography process uses a negative photoresist layer, the image pattern IM may be the transparent region of the photomask 1400.

Figure 8:
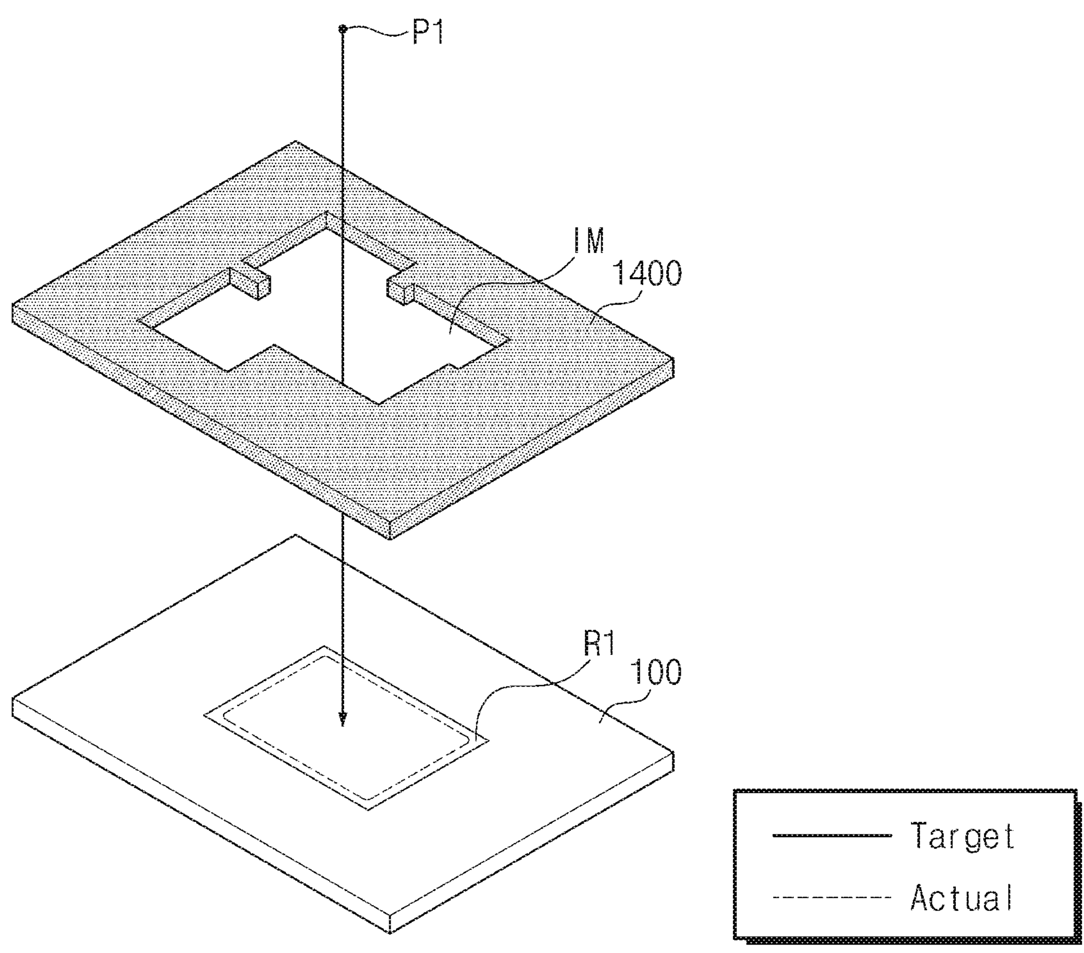
FIG. 8 illustrates a conceptual diagram showing a photolithography process in which the photomask of FIG. 7 is used to print a circuit pattern on a substrate.

FIG. 8 illustrates a conceptual diagram showing a photolithography process in which the photomask of FIG. 7 is used to print a circuit pattern on a substrate according to some embodiments of the present inventive concepts. The point light source P1 of the light source 1200 in FIG. 3 may emit light toward the photomask 1400. The emitted light may pass through the transparent region of the image pattern IM, and may then travel toward the negative photoresist layer on the substrate 100, and the substrate 100 may be exposed to the light in an exposure process. On the negative photoresist layer, a region on which the light is irradiated may remain and a region on which no light is irradiated may be removed in a development process. Therefore, the first circuit pattern R1 corresponding to the image pattern IM may be printed on the substrate 100.

A pattern printed on the substrate 100 is indicated by the dotted line in FIG. 8. The printed pattern may have substantially the same shape and size as those of a target pattern indicated by the solid line. In conclusion, the optical proximity correction may minimize a difference between the actual pattern and the target pattern.

Figure 9:
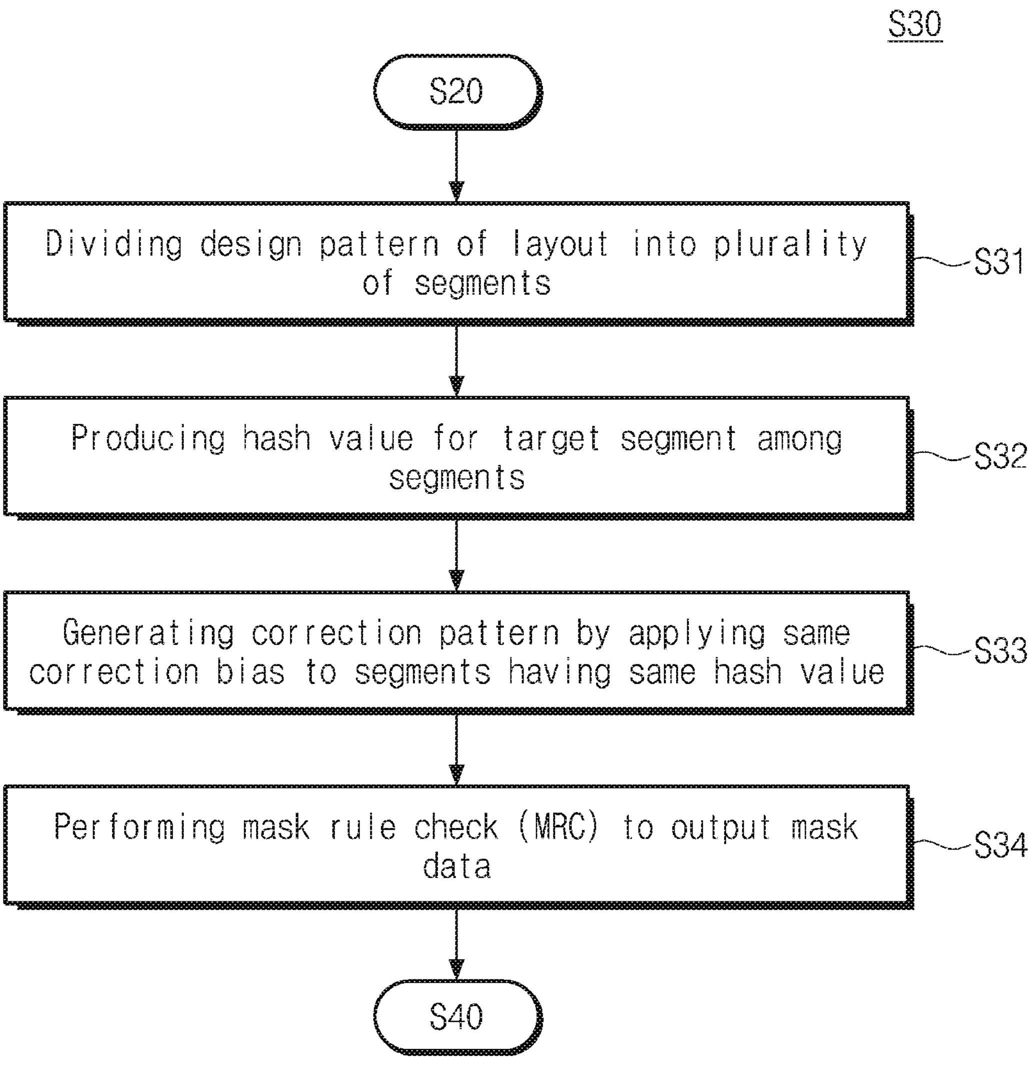
FIG. 9 illustrates a simplified flowchart showing a procedure for optical proximity correction according to some embodiments of the present inventive concepts.
Figure 10:
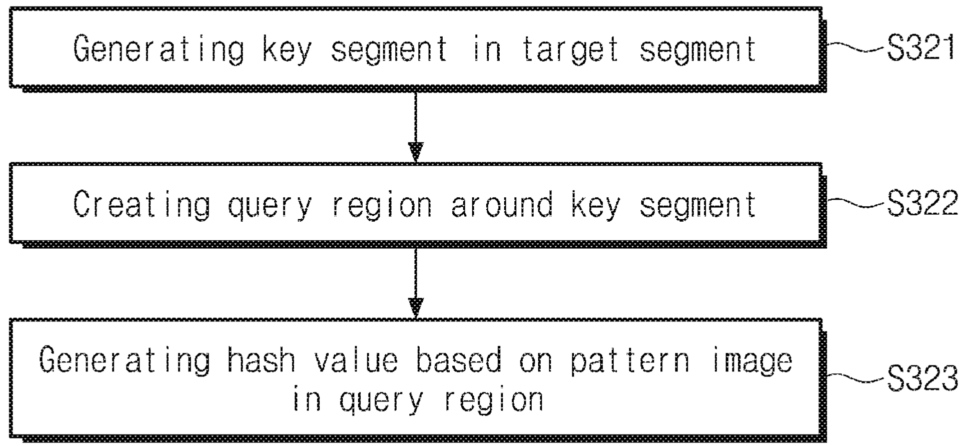
FIG. 10 illustrates a flowchart showing a procedure for producing a hash value of a target segment according to some embodiments of the present inventive concepts.
Figure 11:
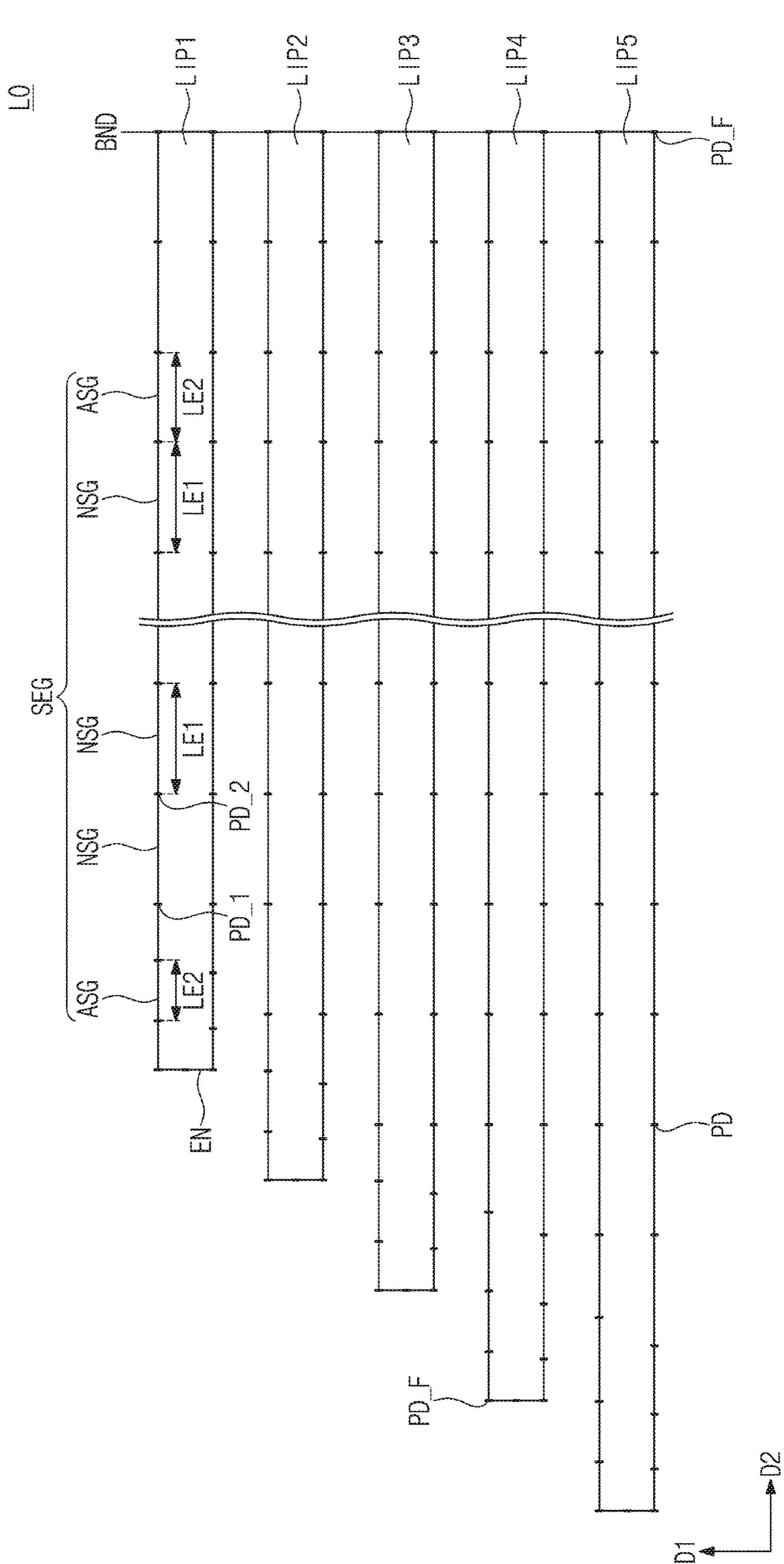
FIG. 11 illustrates a plan view showing a designed layout according to some embodiments of the present inventive concepts.

FIG. 9 illustrates a simplified flowchart showing a procedure for optical proximity correction according to some embodiments of the present inventive concepts. FIG. 10 illustrates a flowchart showing a procedure for producing a hash value of a target segment according to some embodiments of the present inventive concepts. FIG. 11 illustrates a plan view showing a designed layout. FIG. 12, FIG. 13, FIG. 14, FIG. 15, FIG. 16, FIG. 17, FIG. 18, FIG. 19, and FIG. 20 illustrate plan views showing a layout for optical proximity correction according to a comparative example of the present inventive concepts.

Referring to FIG. 9 and FIG. 11, a layout LO may be provided which is produced through the layout design step S20 described herein with reference to FIG. 2. The layout LO may be a single-layered layout. The layout LO may include a plurality of neighboring design patterns LIP1, LIP2, LIP3, LIP4, and LIP5. For example, the plurality of design patterns LIP1 to LIP5 may correspond to the circuit patterns R1 to R4 discussed above with reference to FIG. 4.

The plurality of design patterns LIP1 to LIP5 may be arranged in a line-and-space pattern. For example, each design pattern of the plurality of design patterns LIP1 to LIP5 may be shaped like a line that extends in a second direction D2. The first to fifth design patterns LIP1 to LIP5 may be arranged along a first direction D1. The first to fifth design patterns LIP1 to LIP5 may have the same line-width. The first to fifth design patterns LIP1 to LIP5 may be arranged at a constant pitch.

A data preparation step may be performed on the layout LO including the first to fifth design patterns LIP1 to LIP5. The data preparation step may include performing an optical proximity correction (OPC) step on a designed layout (S30) and performing a mask rule check (MRC) step on the OPC result. The following will describe in detail a procedure for performing optical proximity correction (OPC) according to some embodiments of the present inventive concepts.

Each of the first to fifth design patterns LIP1 to LIP5 may be divided into a plurality of segments SEG (S31). A plurality of division points PD may be generated on a contour of each of the first to fifth design patterns LIP1 to LIP5. For example, a first division point PD_1 and a second division point PD_2 may be generated on the contour of the first design pattern LIP1.

The contour may be divided into a plurality of segments SEG based on the division points PD. The division of each of the first to fifth design patterns LIP1 to LIP5 into a plurality of segments SEG may be performed as described with reference to FIG. 5. For example, the first division point PD_1 and the second division point PD_2 may cause the first design pattern LIP1 to have a normal segment NSG in the contour thereof. The normal segment NSG may have a first length LE1.

The segments SEG may be normal segments NSG having the first length LE1. For example, the normal segments NSG may constitute most of the segments. One or more of the segments SEG may be an abnormal segment ASG having a second length LE2 different from the first length LE1. The second length LE2 may be less than or greater than the first length LE1.

Each of the first to fifth design patterns LIP1 to LIP5 may include the normal segments NSG and the abnormal segments ASG. In some embodiments of the present inventive concepts, an abnormal segment ASG may be adjacent to an end EN of a corresponding one of the first to fifth design patterns LIP1 to LIP5. In some embodiments of the present inventive concepts, an abnormal segment ASG may be positioned on a portion of a design pattern away from the end EN. For example, an abnormal segment ASG of the first design pattern LIP1 may be in a portion of the design pattern adjacent to a boundary BND for parallel execution of optical proximity correction (OPC).

In some embodiments, a design pattern may include only normal segments NSG, for example, when a segment adjacent to an end EN of the design pattern has a same length as the normal segment NSG.

The division points PD may be generated at a constant interval (e.g., the first length LE1) along the length of each of the first to fifth design patterns LIP1 to LIP5. Furthermore, a fixed division point PD_F be generated at the end EN of each of the first to fifth design patterns LIP1 to LIP5. Further still, a fixed division point PD_F be generated on the boundary BND. The fixed division points PD_F whose generation locations are fixed by the end or boundary of a design pattern may have lengths different than the first distance LE1. The fixed division points PD_F may cause the generation of the abnormal segments ASG having the second length LE2.

A hash value of each segment SEG may be generated (S32). For example, the hash value may be generated for a target segment among the segments SEG. The following will describe a method of producing a hash value according to a comparative example of the present inventive concepts.

Figure 12:
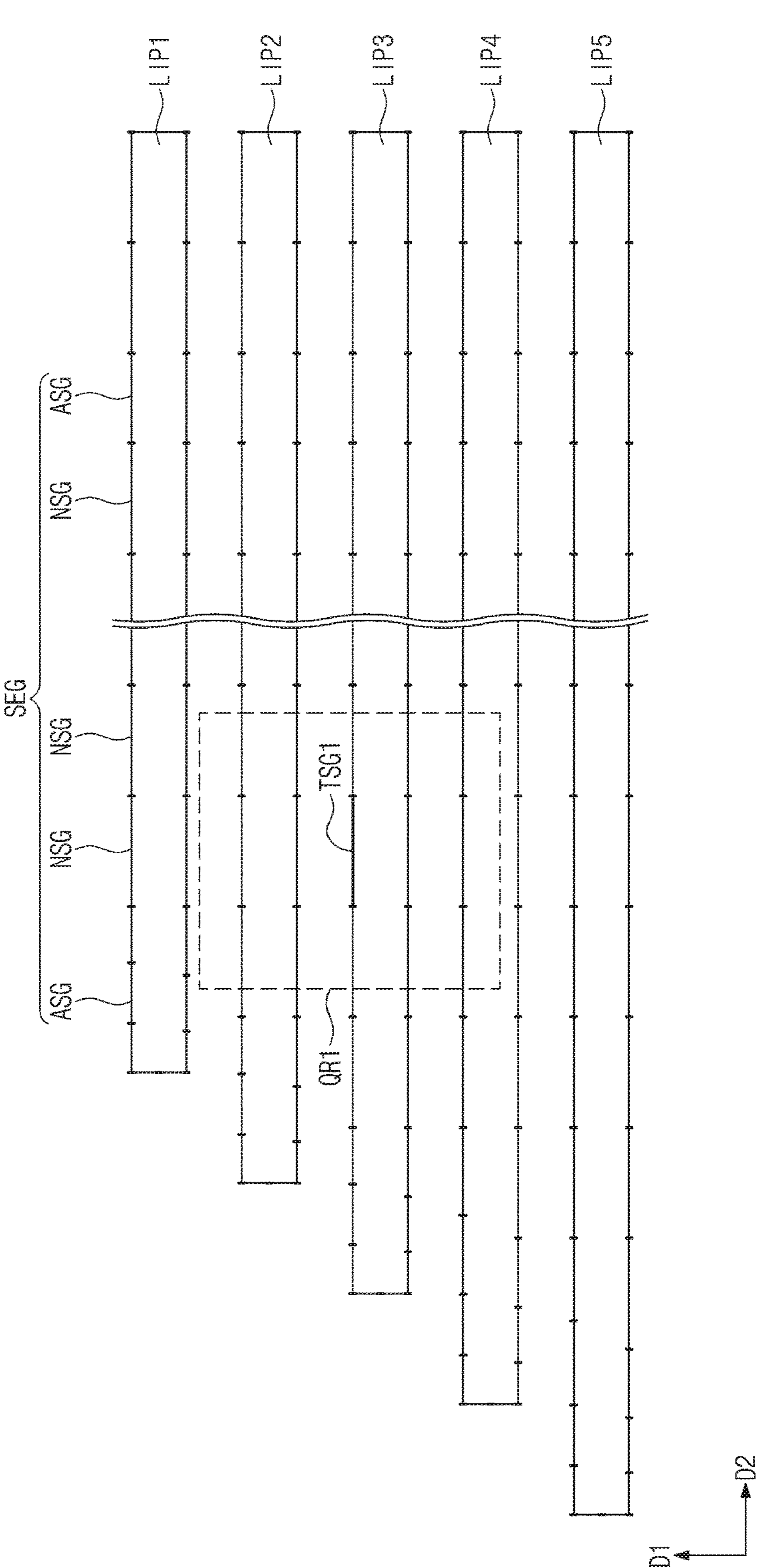
FIG. 12, FIG. 13, FIG. 14, FIG. 15, FIG. 16, FIG. 17, FIG. 18, FIG. 19, and FIG. 20 illustrate plan views showing a layout for optical proximity correction according to a comparative example of the present inventive concepts.

Referring to FIG. 12, a hash value may be obtained for a first target segment TSG1 among the segments SEG. For example, it may be possible to create a first query region QR1 around the first target segment TSG1. The first query region QR1 may be a peripheral area capable of optically affecting the first target segment TSG1.

Figure 13:
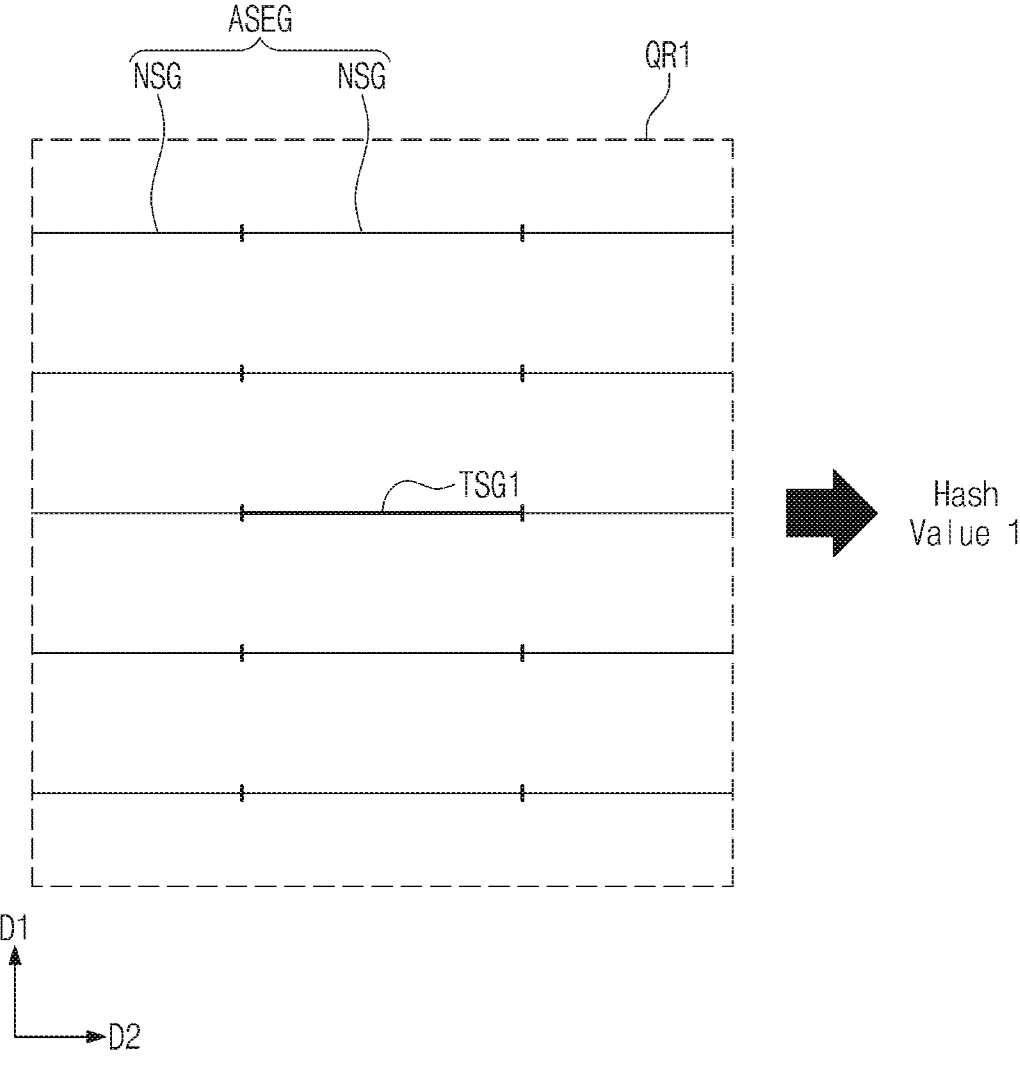

FIG. 13 illustrates a plan view showing the first query region QR1. The first query region QR1 may include the first target segment TSG1 and the peripheral segments ASEG around the first target segment TSG1. For example, the peripheral segments ASEG in the first query region QR1 may include only the normal segments NSG.

A first hash value may be produced on the basis of a length of the first target segment TSG1, a length of each of the peripheral segments ASEG in the first query region QR1, and a distance between the peripheral segments ASEG in first query region QR1 and the first target segment TSG1. A first hash value of the first target segment TSG1 may be Hash Value 1 (see FIG. 13). The first hash value may be a value reflecting information about the length of the first target segment TSG1, the length of each of the peripheral segments ASEG in the first query region QR1, and the distance between the peripheral segments ASEG in first query region QR1 and the first target segment TSG1. For example, the first hash value may be produced as a 64-bit unique value.

Figure 14:
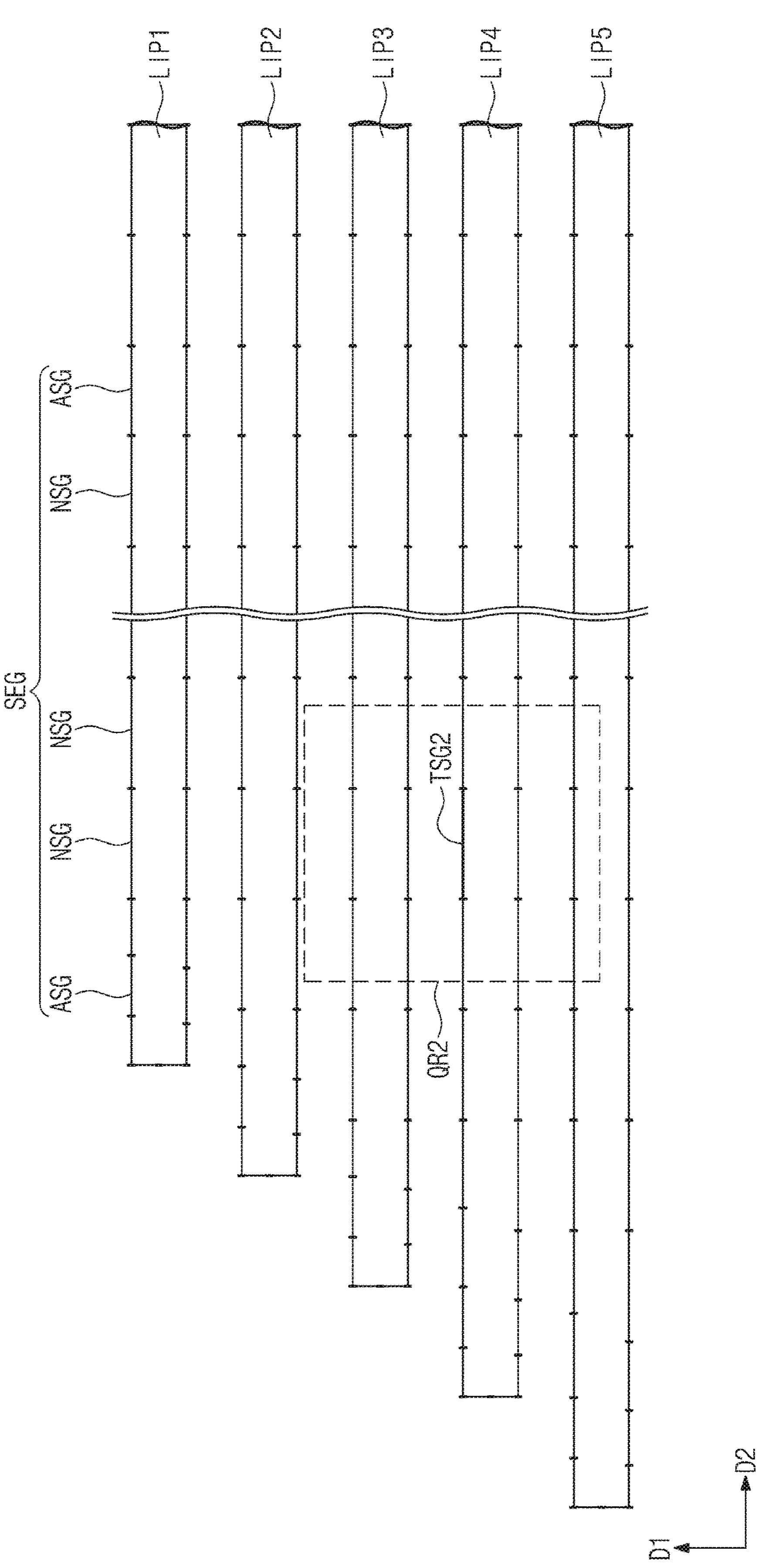

Referring to FIG. 14, a hash value may be obtained for a second target segment TSG2 among the segments SEG. For example, a second query region QR2 may be created around the second target segment TSG2.

Figure 15:
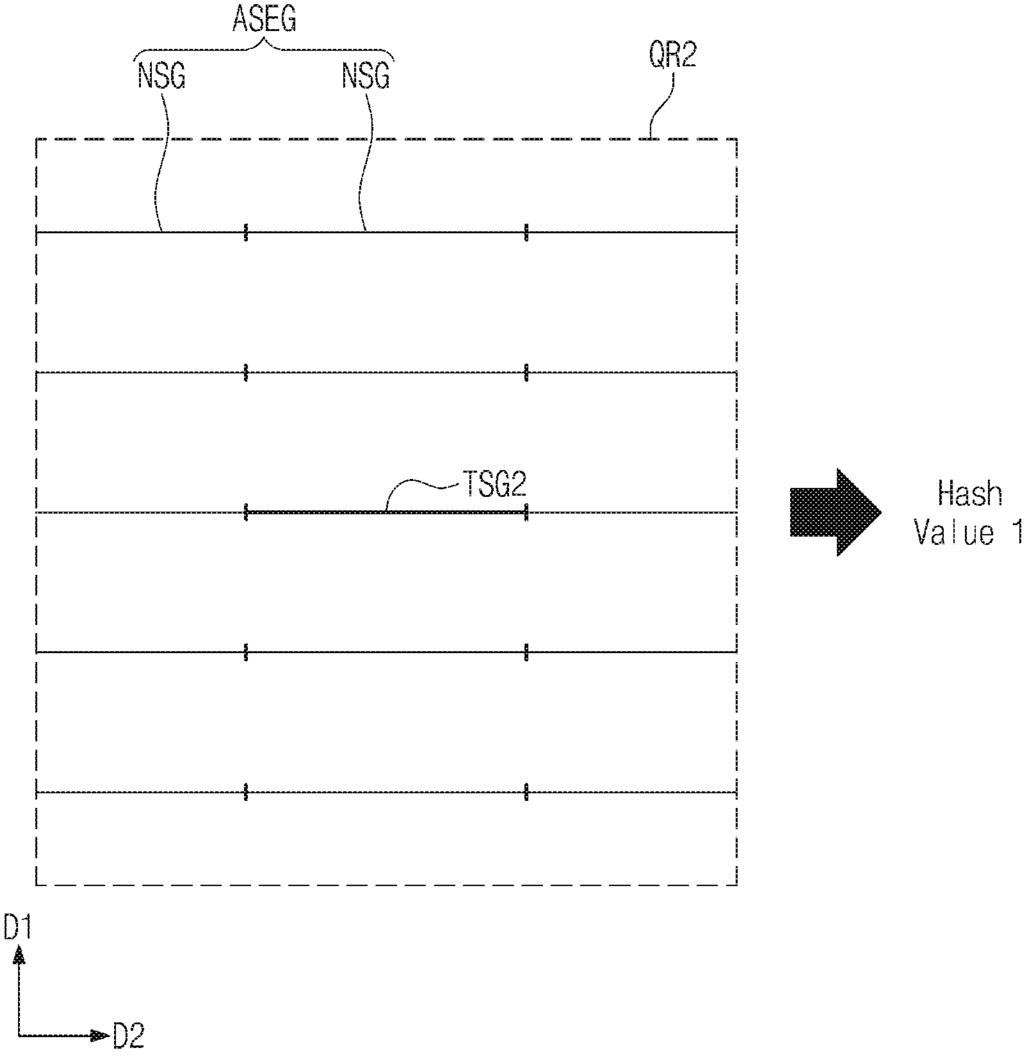

FIG. 15 illustrates a plan view showing the second query region QR2. The second query region QR2 may include the second target segment TSG2 and the peripheral segments ASEG around the second target segment TSG2. For example, the peripheral segments ASEG in the second query region QR2 may include only the normal segments NSG.

A second hash value may be produced on the basis of information in the second query region QR2. The second hash value of the second target segment TSG2 may be Hash Value 1 (see FIG. 15). For example, the second hash value of the second target segment TSG2 may be the same as the first hash value of the first target segment TSG1 discussed above. In this example, both the first target segment TSG1 and the second target segment TSG2 have Hash Value 1. This may be caused by the fact that a length of the second target segment TSG2 is the same as the length of the first target segment TSG1, and in addition that the lengths of the peripheral segments ASEG in the second query region QR2 are the same as the lengths of the peripheral segments ASEG in the first query region QR1.

Figure 16:
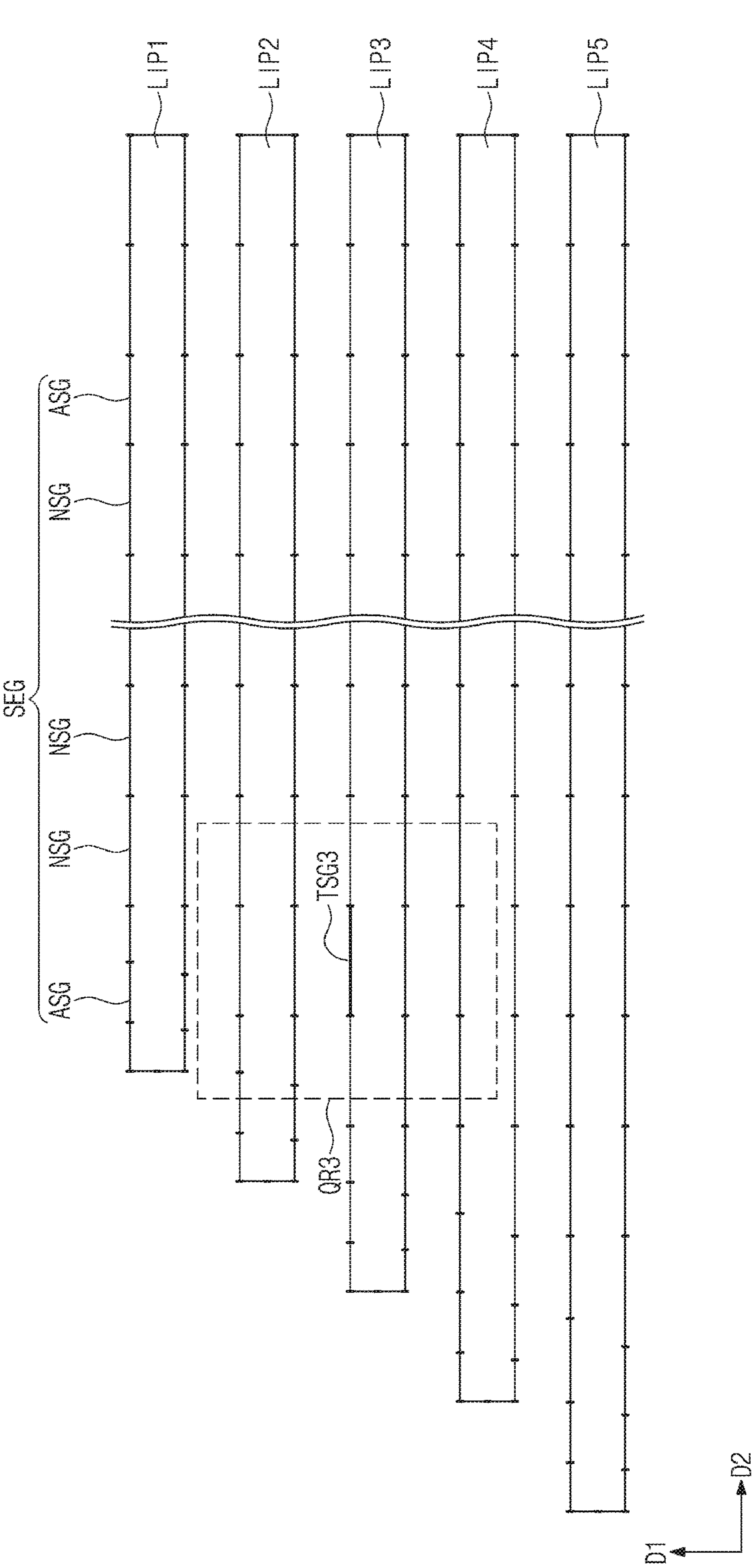

Referring to FIG. 16, a hash value may be obtained for a third target segment TSG3 among the segments SEG. For example, a third query region QR3 may be created around the third target segment TSG3.

Figure 17:
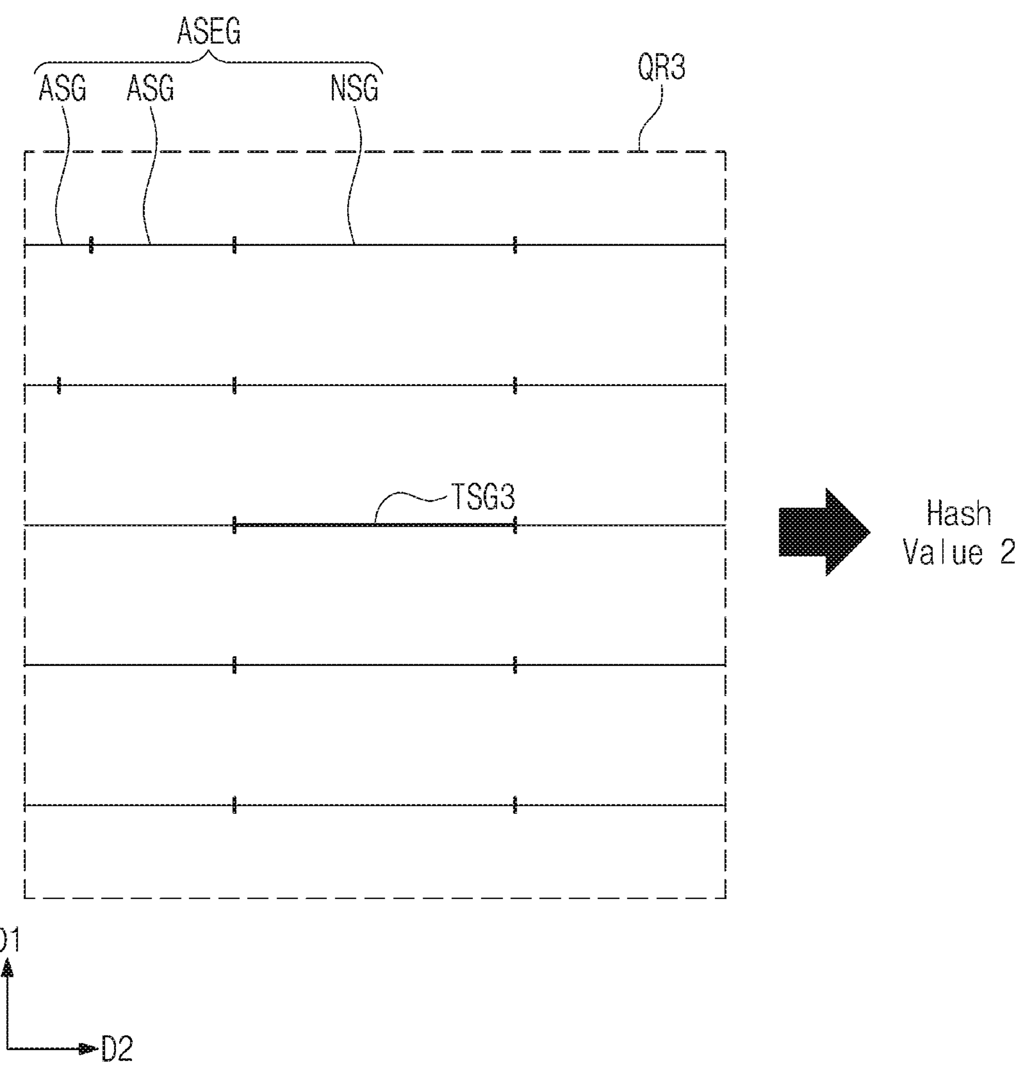

FIG. 17 illustrates a plan view showing the third query region QR3. The third query region QR3 may include the third target segment TSG3 and the peripheral segments ASEG around the third target segment TSG3. For example, the peripheral segments ASEG in the third query region QR3 may include the normal segments NSG and the abnormal segments ASG.

A third hash value may be produced on the basis of information in the third query region QR3. The third hash value of the third target segment TSG3 may be Hash Value 2 (see FIG. 17). For example, the third hash value of the third target segment TSG3 may be different than the first hash value of the first target segment TSG1 discussed above.

A pattern image in the first query region QR1 of FIG. 13 may be the same as a pattern image in the third query region QR3 of FIG. 17. However, because the peripheral segment ASEG of the third query region QR3 includes at least one abnormal segment ASG, the OPC tool (see 34 of FIG. 1) may provide the third query region QR3 with Hash Value 2, different than Hash Value 1.

Figure 18:
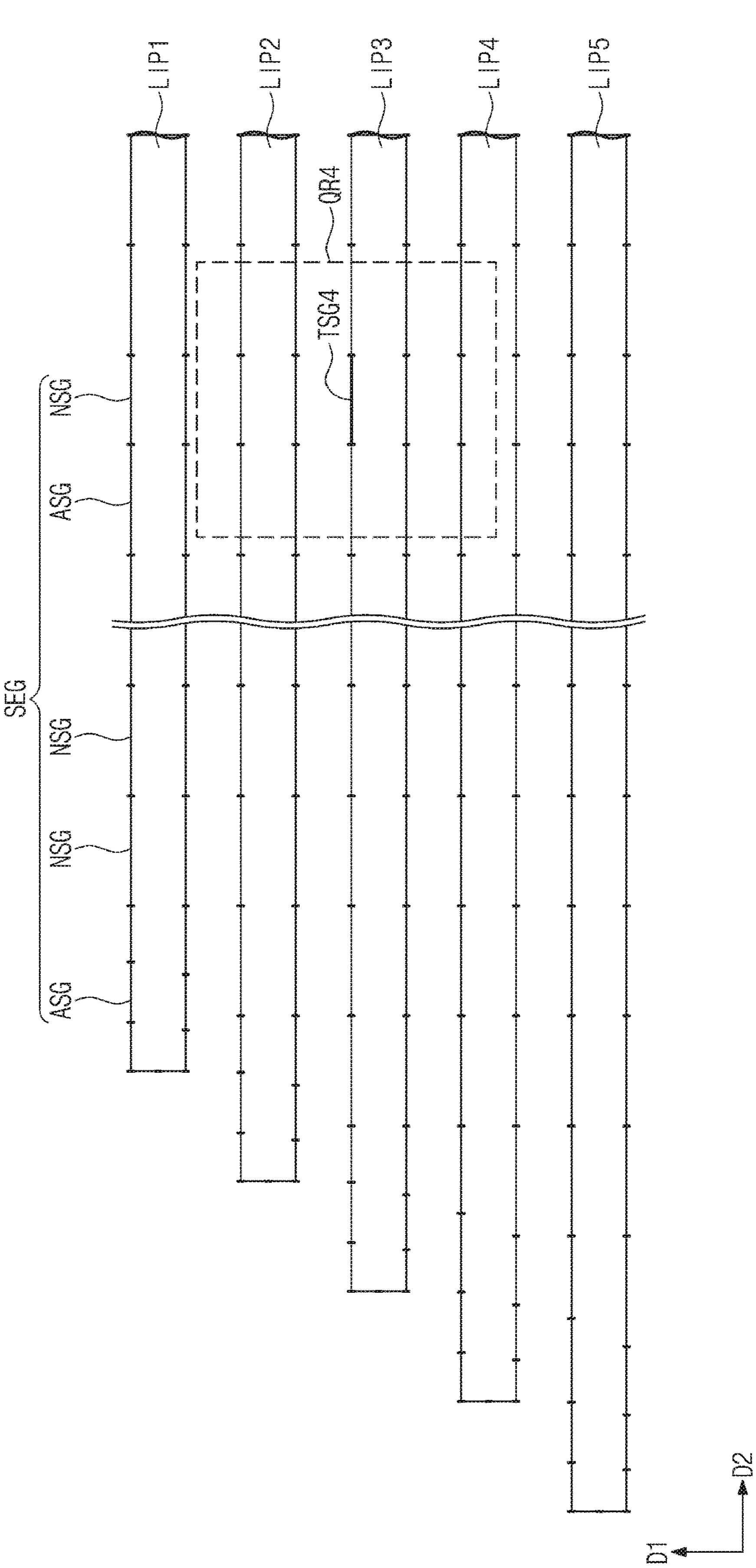

Referring to FIG. 18, a hash value may be obtained of a fourth target segment TSG4 among the segments SEG. For example, a fourth query region QR4 may be created around the fourth target segment TSG4.

Figure 19:
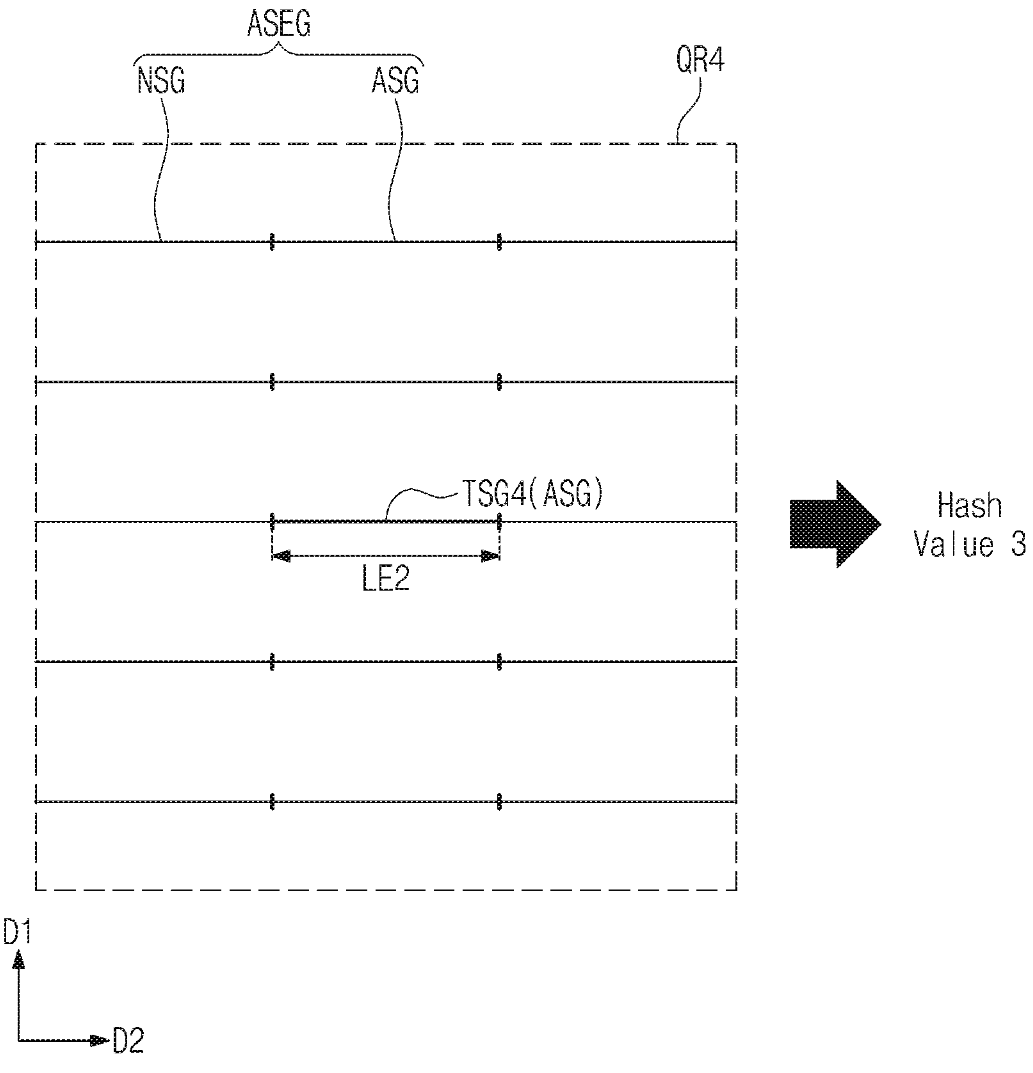

FIG. 19 illustrates a plan view showing the fourth query region QR4. The fourth query region QR4 may include the fourth target segment TSG4 and the peripheral segments ASEG around the fourth target segment TSG4. Each of the first to third target segments TSG1 to TSG3 discussed above may be a normal segment NSG having the first length LE1, and the fourth target segment TSG4 may be an abnormal segment ASG having the second length LE2. In addition, the peripheral segments ASEG in the fourth query region QR4 may include the normal segments NSG and the abnormal segments ASG.

A fourth hash value may be produced on the basis of information in the fourth query region QR4. The fourth hash value of the fourth target segment TSG4 may be Hash Value 3 (see FIG. 19). For example, the fourth hash value of the fourth target segment TSG4 may be different than the first hash value of the first target segment TSG1 and the second hash value of the third target segment TSG3 discussed above.

A pattern image in the first query region QR1 of FIG. 13 may be the same as a pattern image in the fourth query region QR4 of FIG. 19. However, because the fourth target segment TSG4 of the fourth query region QR4 is an abnormal segment ASG, and because the peripheral segment ASEG of the fourth target segment TSG4 includes an abnormal segment ASG, the OPC tool (see 34 of FIG. 1) may provide the fourth query region QR4 with the Hash Value 3 different from Hash Value 1 and Hash Value 2.

In conclusion, according to a comparative example of the present inventive concepts, the OPC tool (see 34 of FIG. 1) may interpret that the first target segment TSG1 and the second target segment TSG2 have the same hash value (or Hash Value 1), and may classify the first target segment TSG1 and the second target segment TSG2 as being a same segment for purposes of providing a correction bias. Therefore, when optical proximity correction (OPC) is performed, the same correction bias may be provided to the first target segment TSG1 and the second target segment TSG2.

According to a comparative example of the present inventive concepts, the OPC tool (see 34 of FIG. 1) may classify the first target segment TSG1 and the third target segment TSG3 as being different segments from each other for purposes of providing a correction bias. Therefore, when optical proximity correction (OPC) is performed, the third target segment TSG3 may be provided with a correction bias different from that provided to the first target segment TSG1 and the second target segment TSG2.

According to a comparative example of the present inventive concepts, the OPC tool (see OPC tool 34 of FIG. 1) may classify the first target segment TSG1 and the fourth target segment TSG4 into different segments from each other for purposes of providing a correction bias. Therefore, when optical proximity correction (OPC) is performed, the fourth target segment TSG4 may be provided with a correction bias different from that provided to the first target segment TSG1 and the second target segment TSG2.

Figure 20:
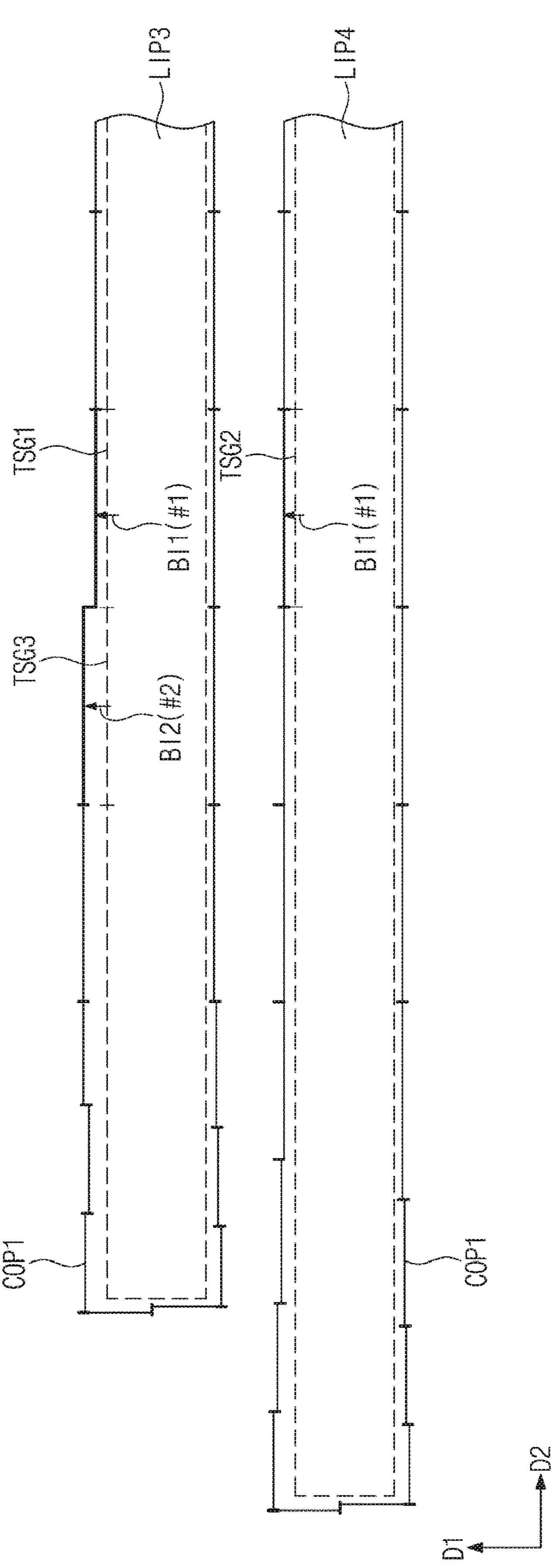

Referring to FIG. 20, the segments SEG of the third design pattern LIP3 and fourth design pattern LIP4 may be biased (or changed) to generate a first correction pattern COP1 and a second correction pattern COP2.

For example, each of the first target segment TSG1 and the second target segment TSG2 may be biased (or changed) in the first direction D1 by as much as a first correction bias BI1. Because the first target segment TSG1 and the second target segment TSG2 have the same Hash Value 1 (#1), an OPC tool may provide the same correction bias to the first target segment TSG1 and the second target segment TSG2, with the result that first target segment TSG1 and the second target segment TSG2 may be identically biased (or changed) I.

The third target segment TSG3 may be biased (or changed) in the first direction D1 by as much as a second correction bias BI2. The second correction bias BI2 may be different from the first correction bias BI1. Because the third target segment TSG3 has a different Hash Value 2 (#2) from that of the first target segment TSG1, an OPC tool may provide the third target segment TSG3 with a different correction bias than that provided to the first target segment TSG1.

As described herein, a same pattern image may be used for the first query region QR1, the second query region QR2, and the third query region QR3 on the basis of the first target segment TSG1, the second target segment TSG2, and the third target segment TSG3. Because the first target segments TSG1, the second target segments TSG2, and the third target segment TSG3 may be classified as the same segment having a same surrounding environment for purposes of providing a correction bias, the first to third target segments TSG1 to TSG3 may be provided with the same correction bias, which may achieve a consistency of optical proximity correction (OPC).

According to a comparative example of the present inventive concepts, because the OPC step (or OPC tool) may produce a hash value based, not on an image of a query region, but on a length of each of segments in a query region, and accordingly the hash value (#2) of the third target segment TSG3 may be different from the hash value (#1) of the first target segment TSG1. An optical proximity correction (OPC) method according to a comparative example may cause problems such as inaccuracies in finally generated correction patterns COP1 and COP2, and delays in the optical proximity correction.

Figure 21:
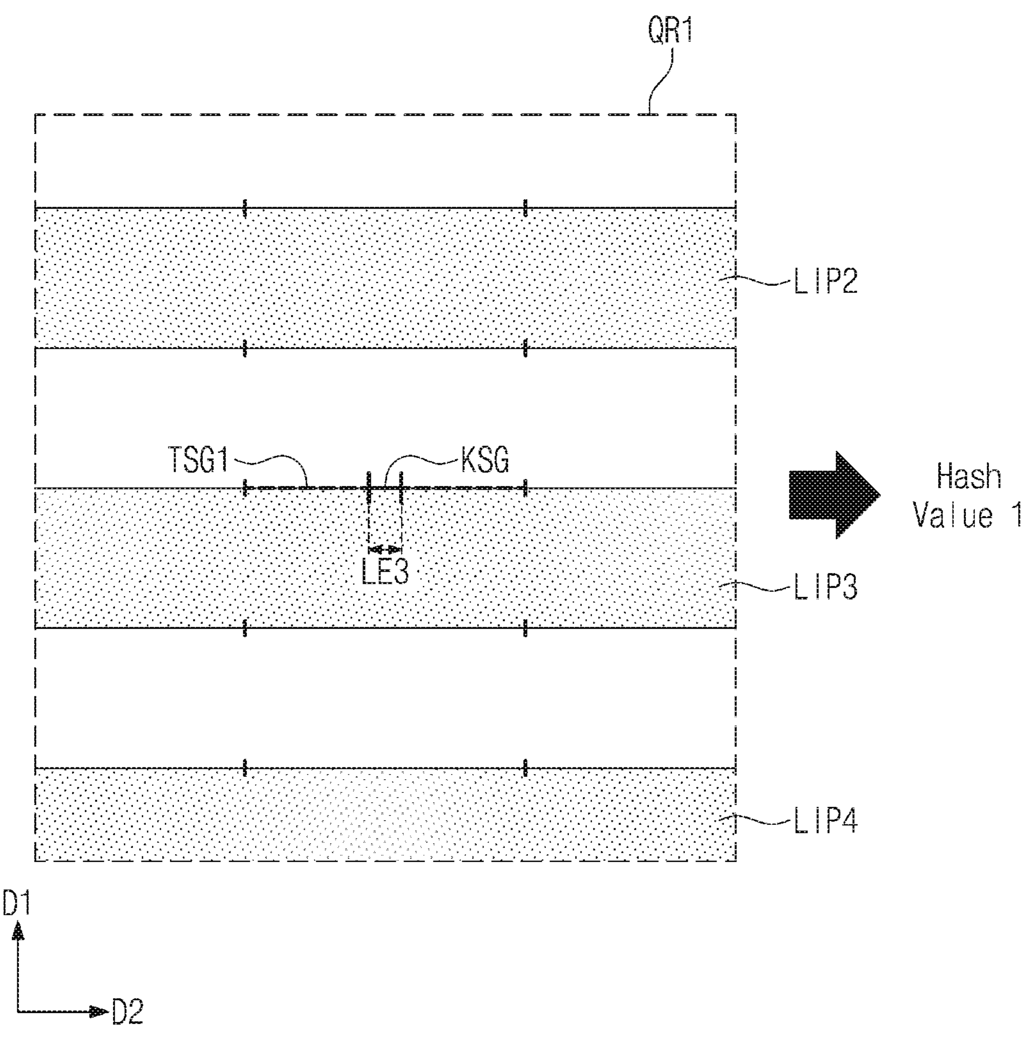
FIG. 21 FIG. 22, and FIG. 23 illustrate plan views showing a layout for producing a hash value of a target segment according to some embodiments of the present inventive concepts.
Figure 22:
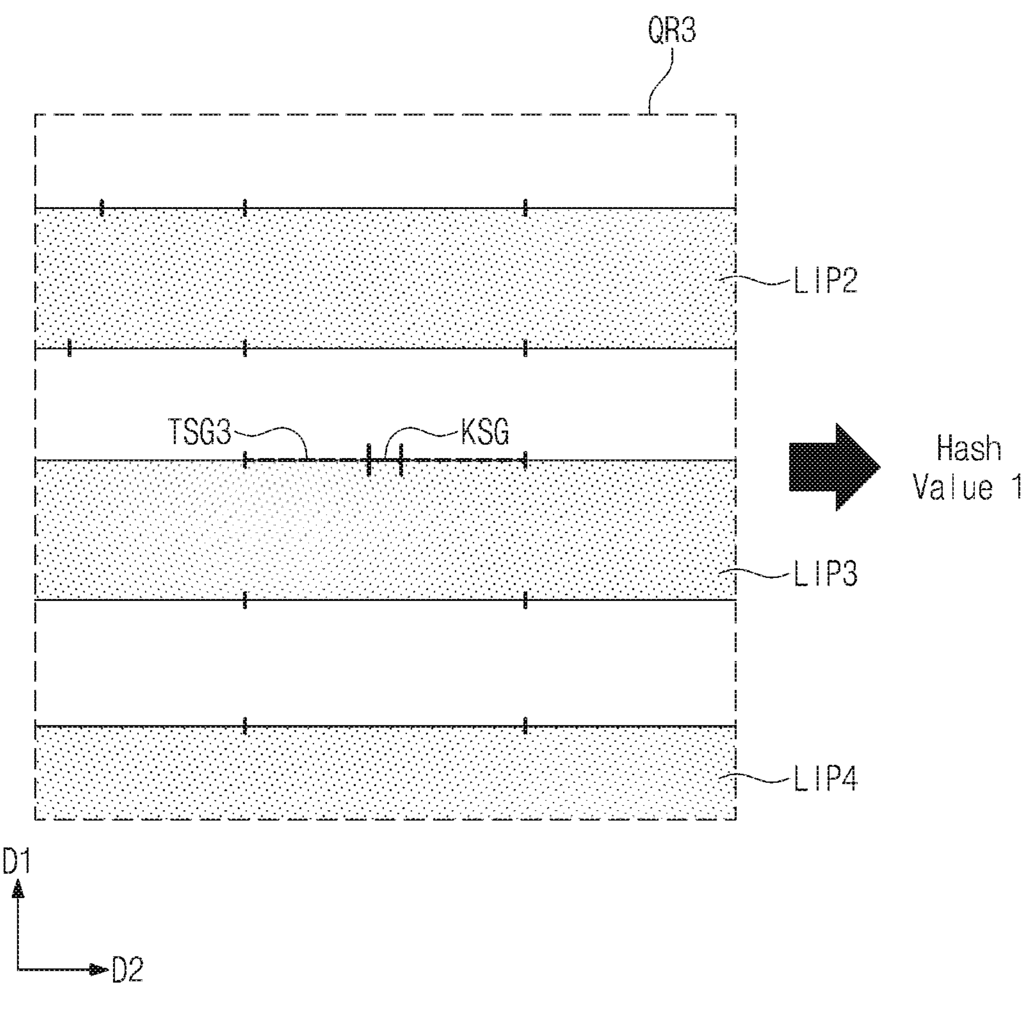
Figure 23:
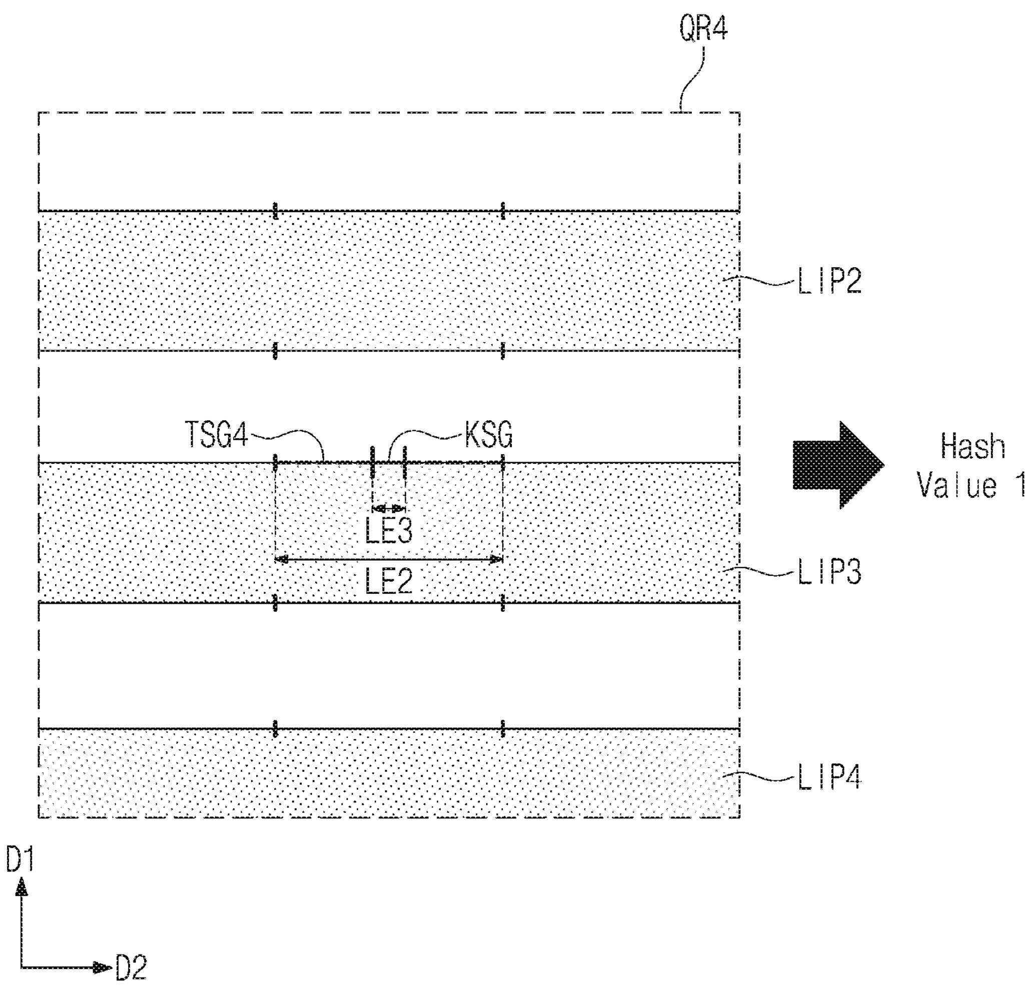
Figure 24:
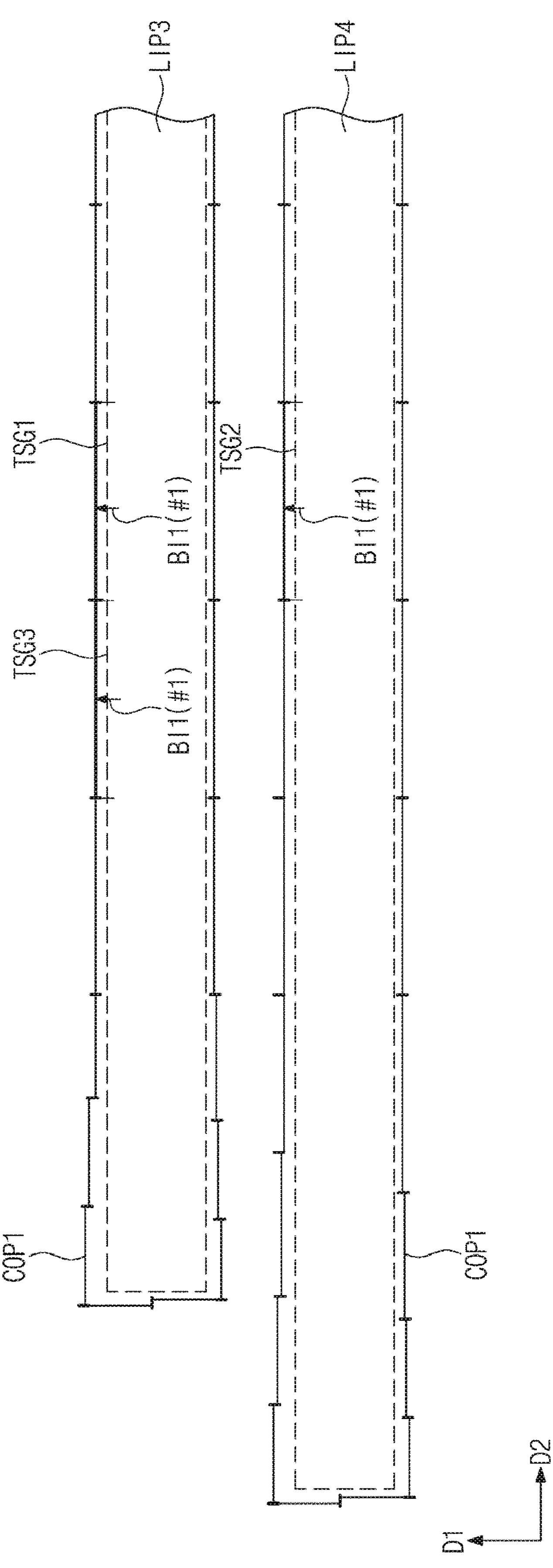
FIG. 24 illustrates a plan view showing a layout for optical proximity correction according to some embodiments of the present inventive concepts.

FIG. 21 FIG. 22, and FIG. 23 illustrate plan views showing a layout for producing a hash value of a target segment according to some embodiments of the present inventive concepts. FIG. 24 illustrates a plan view showing a layout for optical proximity correction according to some embodiments of the present inventive concepts.

In this description, the term "DBU" may indicate a DataBase Unit. A DBU may be a unit length used in the OPC tool 34. For example, a DBU may be a minimum length unit used in the OPC tool 34.

Referring to FIG. 10 and FIG. 21, a key segment KSG may be generated for the first target segment TSG1 (S321). The key segment KGS may be generated on a center of the first target segment TSG1. For example, the key segment KSG may be generated in a range between −1 DBU and +1 DBU from a center of the first target segment TSG1. Thus, the key segment KSG may have a third length LE3 of 2 DBU. The key segment KSG may have a center aligned with that of the first target segment TSG1.

A first query region QR1 may be created around the key segment KSG of the first target segment TSG1 (S322). The first query region QR1 may include a portion of the second design pattern LIP2, a portion of the third design pattern LIP3, and a portion of the fourth design pattern LIP4. A first hash value may be produced on the basis of a pattern image shown in the first query region QR1 (S323). Hash Value 1 may be produced as the first hash value of the first target segment TSG1 (see FIG. 21).

The first hash value according to some embodiments of the present inventive concepts may be a value calculated based on image information of patterns around the key segment KSG without considering any peripheral segment ASEG, as described above with reference to FIG. 13. For example, the first hash value may be calculated based on first information and second information. The first information may be relevant to length and direction of the key segment KSG of the first target segment TSG1. The second information may be relevant to a pattern image around the key segment KSG.

Referring to FIG. 10 and FIG. 22, a key segment KSG may be generated for the third target segment TSG3 (S321). The key segment KSG of the third target segment TSG3 may have a length LE3. The length LE3 may be the same as that of the key segment KSG of the first target segment TSG1 described above.

A third query region QR3 may be created around the key segment KSG of the third target segment TSG3 (S322). The third query region QR3 may include a portion of the second design pattern LIP2, a portion of the third design pattern LIP3, and a portion of the fourth design pattern LIP4. A third hash value may be produced on the basis of a pattern image shown in the third query region QR3 (S323). Hash Value 1 may be produced as the third hash value of the third target segment TSG3 (see FIG. 22).

According to some embodiments of the present inventive concepts, the third hash value (Hash Value 1) of the third target segment TSG3 may be the same as the first hash value (Hash Value 1) of the first target segment TSG1. This may be caused by the fact that the hash values may be calculated based on a pattern image in a query region, and not on a peripheral segment in a query region. Therefore, the same hash value may be given to the first target segment TSG1 and the third target segment TSG3 having the same peripheral pattern shape or image.

Referring to FIG. 10 and FIG. 23, a key segment KSG may be generated for the fourth target segment TSG4 (S321). The key segment KSG of the fourth target segment TSG4 may have a length LE3. The length LE3 may be the same as that of the key segment KSG of the first target segment TSG1 described above.

As described above, the length LE2 of the fourth target segment TSG4 may be different from the length LE1 of the first target segment TSG1. The key segment KSG may be generated such that the key segment KSG of the fourth target segment TSG4 may have the length LE3, which may be the same length as that of the key segment KSG of the first target segment TSG1.

A fourth query region QR4 may be created around the key segment KSG of the fourth target segment TSG4 (S322). The fourth query region QR4 may include a portion of the second design pattern LIP2, a portion of the third design pattern LIP3, and a portion of the fourth design pattern LIP4. A fourth hash value may be produced on the basis of a pattern image shown in the fourth query region QR4 (S323). Hash Value 1 may be produced as the fourth hash value of the fourth target segment TSG4 (see FIG. 23).

According to some embodiments of the present inventive concepts, the fourth hash value (Hash Value 1) of the fourth target segment TSG4 may be the same as the first hash value (Hash Value 1) of the first target segment TSG1. This may be caused by the fact that a hash value may be calculated based on a pattern image in a query region, and not on a peripheral segment in a query region. In addition, this may be caused by the fact that the key segment KSG of the fourth target segment TSG4 has a length LE3, which may be the same length as that of the key segment KSG of the first target segment TSG1. For at these reasons, an OPC tool according to some embodiments of the present inventive concepts may provide the third target segment TSG3 with Hash Value 1, which may be the same as that provided to the first target segment TSG1.

Referring to FIG. 9 and FIG. 24, the segments SEG of the third design pattern LIP3 and the fourth design pattern LIP4 may be biased (or changed) to generate a first correction pattern COP1 and a second correction pattern COP2.

As described above with reference to FIG. 20, each of the first target segment TSG1 and the second target segment TSG2 may be biased (or changed) in the first direction D1 by as much as a first correction bias BI1. Because the first target segment TSG1 and the second target segment TSG2 have the same Hash Value 1 (#1), an OPC tool may provide the same correction bias to the first target segment TSG1 and the second target segment TSG2, with the result that first target segment TSG1 and the second target segment TSG2 may be identically biased (or changed).

Moreover, according to some embodiments of the present inventive concepts, the third target segment TSG3 may also be biased (or changed) in the first direction D1 by as much as a second correction bias BI2. According to a method of producing a hash value in accordance with some embodiments of the present inventive concepts, the third target segment TSG3 and the first target segment TSG1 may have the same Hash Value 1 (#1) as described above. Therefore, an OPC tool may provide the third target segment TSG3 with the first correction bias BI1, which may be the same as that provided to the first target segment TSG1.

According to some embodiments of the present inventive concepts, because the first target segment TSG1, the second target segment TSG2, and the third target segment TSG3 are segments having a same surrounding environment, the same hash value may be given to the first to third target segments TSG1 to TSG3, without being limited by information of peripheral segments. Therefore, the same correction bias BI1 may be applied to the first to third target segments TSG1 to TSG3 (S33).

When correction patterns COP are generated for design patterns LIP, a mask rule check (MRC) step may be performed on the created correction pattern COP (S34). The correction pattern COP may be additionally corrected by the MRC step, and thus it may be possible to adjust for, or solve, mask rule violations. Accordingly, the data preparation step may be terminated, and results may be output as mask data.

As discussed above with reference to FIG. 2, FIG. 7, and FIG. 8, the mask data may be used to manufacture the photomask 1400. The substrate 100 may undergo a photolithography process in which the photomask 1400 is used to print an image pattern. Therefore, intended patterns may be implemented on the substrate 100. The patterns may be formed having shapes and sizes the same as those of the first to fifth design patterns LIP1 to LIP5 described above with reference to FIG. 11. As a result, methods according to some embodiments of the present inventive concepts may implement target patterns on each layer to fabricate a semiconductor device (S50 of FIG. 2).

The OPC step according to a comparative example described above with reference to FIG. 20 may have a problem that the third target segment TSG3 is provided with a correction bias different from that provided to the first target segment TSG1 and the second target segment TSG2. For example, in a comparative example described above, there may be problems such as a reduction in consistency and accuracy of optical proximity correction. In addition, a separate correction bias may need to be applied to the third target segment TSG3, and this may cause a delay in optical proximity correction.

In contrast, according to some embodiments of the present inventive concepts, the OPC step discussed above with reference to FIG. 10, FIG. 21, FIG. 22, FIG. 23, and FIG. 24 may produce the same hash value for segments having a same surrounding environment for purposes of providing a correction bias. Therefore, the third target segment TSG3 may be provided with the same correction bias BI1 as that provided to the first target segment TSG1 and the second target segment TSG2. In conclusion, embodiments of the present inventive concepts may maintain consistency of optical proximity correction (OPC), increase in accuracy of OPC, and reduce in OPC execution time.

FIG. 25, FIG. 26, FIG. 27, and FIG. 28 illustrate plan views showing a layout for producing a hash value and a key segment according to some embodiments of the present inventive concepts. In embodiments that follows, a detailed description of technical features repetitive to those of the OPC step discussed above will be omitted, and a difference thereof will be discussed in detail.

Figure 25:
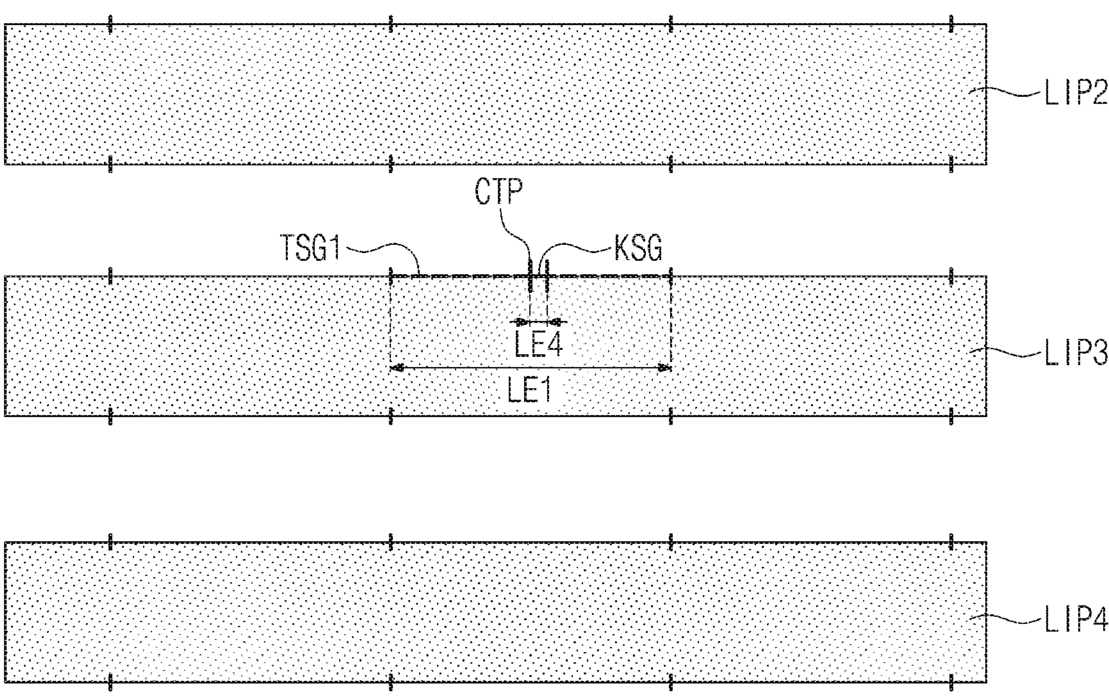
FIG. 25, FIG. 26, FIG. 27, and FIG. 28 illustrate plan views showing a layout for producing a hash value and a key segment according to some embodiments of the present inventive concepts.

Referring to FIG. 25, the first length LE1 of the first target segment TSG1 may be (2×N)+1 DBU. The symbol N may be an integer equal to or greater than 1. For example, the first length LE1 may be an odd number.

When the first length LE1 is an odd number, the key segment KSG described above with reference to FIG. 21 may be generated which may be aligned with a center of the first target segment TSG1. For example, when the first length LE1 is 11 DBU, a center of the key segment KSG may need to be aligned with a point that corresponds to 5.5 DBU of the first target segment TSG1. However, because 5.5 DBU is a coordinate that an OPC tool does not recognize, there may occur a problem that the key segment KSG cannot be exactly generated on the center of the first target segment TSG1.

Therefore, the first length LE1 may be divided in half and rounded down to obtain a point, or start point, and thus the key segment KSG according to some embodiments of the present embodiment may be generated having a fourth length LE4. The point may be N DBU. For example, the fourth length LE4 may be 1 DBU. For example, when the first length LE1 is 11 DBU, the key segment KSG may be generated with 5 DBU as a start point. Therefore, the key segment KSG may be generated according to a certain rule irrespective of whether a length of the first target segment TSG1 is an odd or even number.

Figure 26:
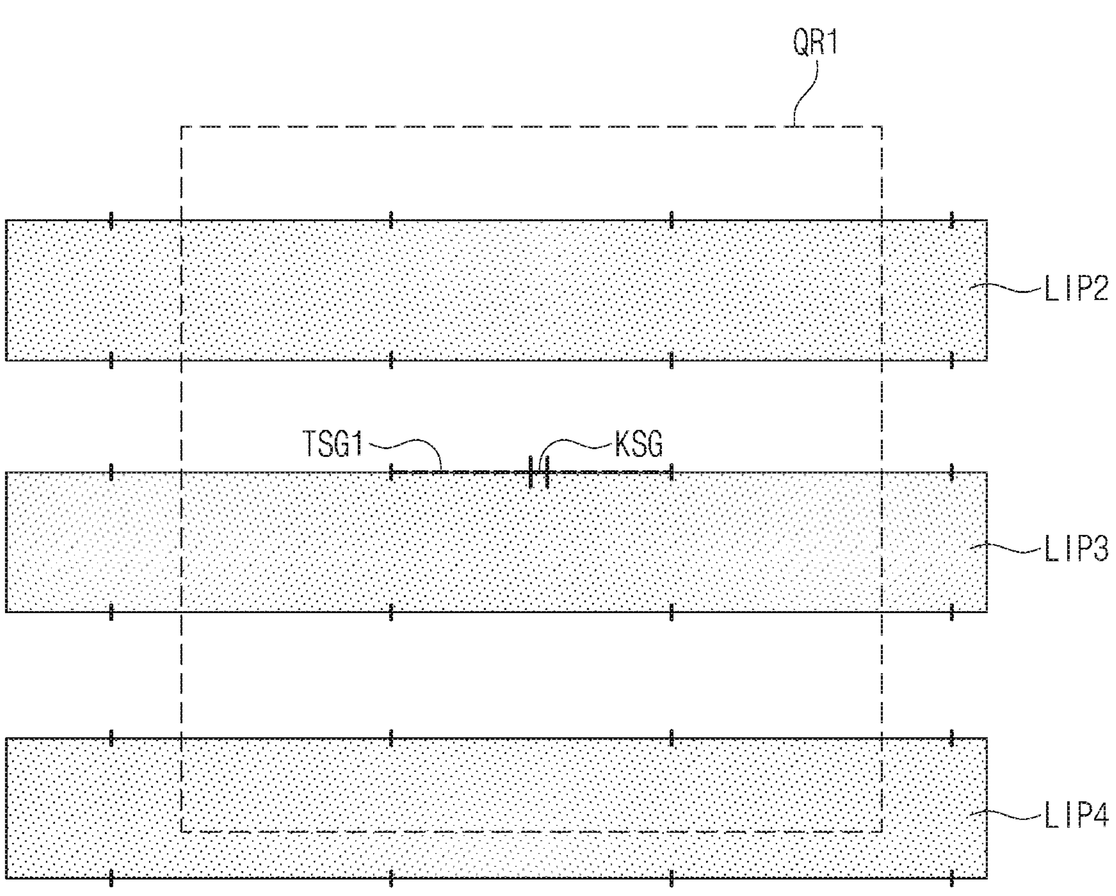

Referring to FIG. 26, a first query region QR1 may be created around the key segment KSG generated in FIG. 25. A first hash value may be produced for the first target segment TSG1 on the basis of information about a pattern image in the first query region QR1.

Figure 27:
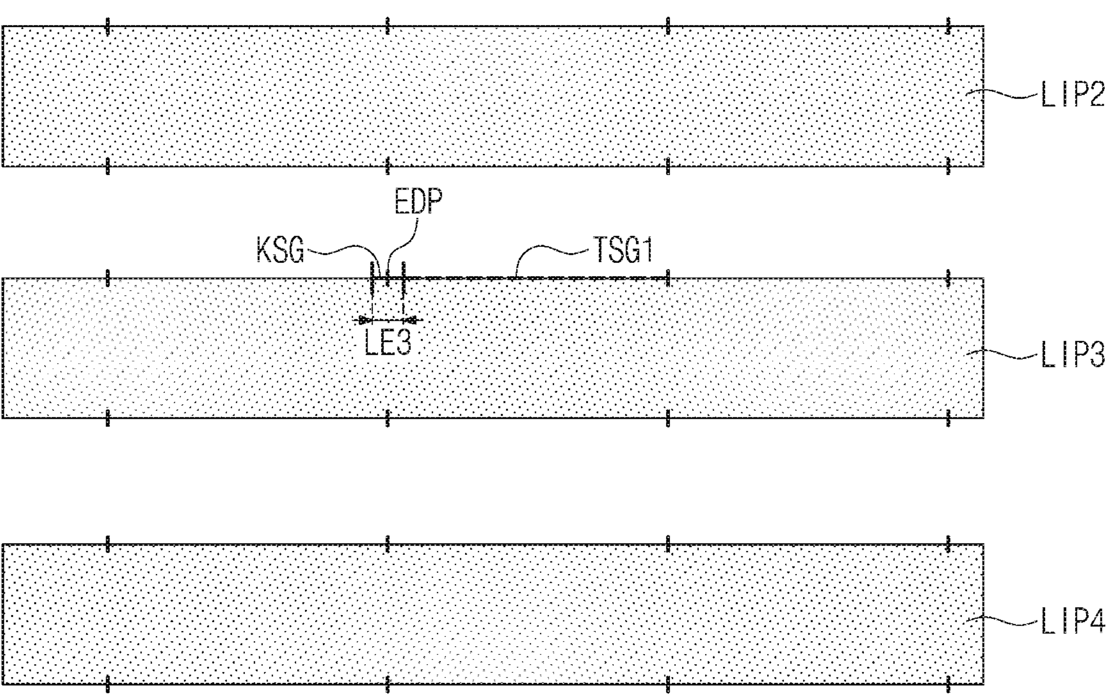

Referring to FIG. 27, a key segment KSG may be generated around an end EDP of the first target segment TSG1. For example, the key segment KSG may be generated in a range between −1 DBU and +1 DBU from the end EDP of the key segment KSG. For example, a length LE3 of the key segment KSG may be 2 DBU. A method of generating the key segment KSG according to some embodiments of the present embodiment may solve a problem that arises when a length of the first target segment TSG1 is an odd number as described above in FIG. 25. Therefore, the key segment KSG may be generated according to a certain rule irrespective of whether a length of the first target segment TSG1 is an odd or even number.

Figure 28:
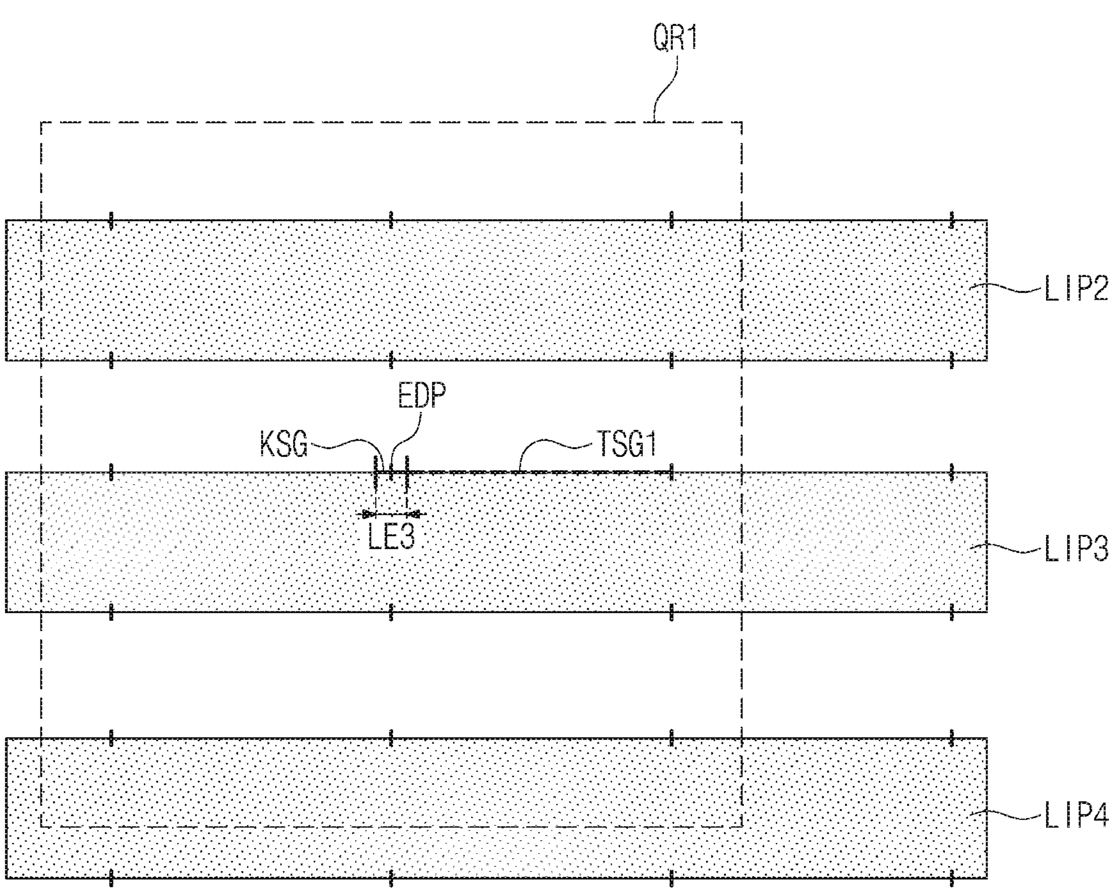

Referring to FIG. 28, a first query region QR1 may be created around the key segment KSG generated in FIG. 27. A first hash value may be produced for the first target segment TSG1 on the basis of information about a pattern image in the first query region QR1.

Figure 29:
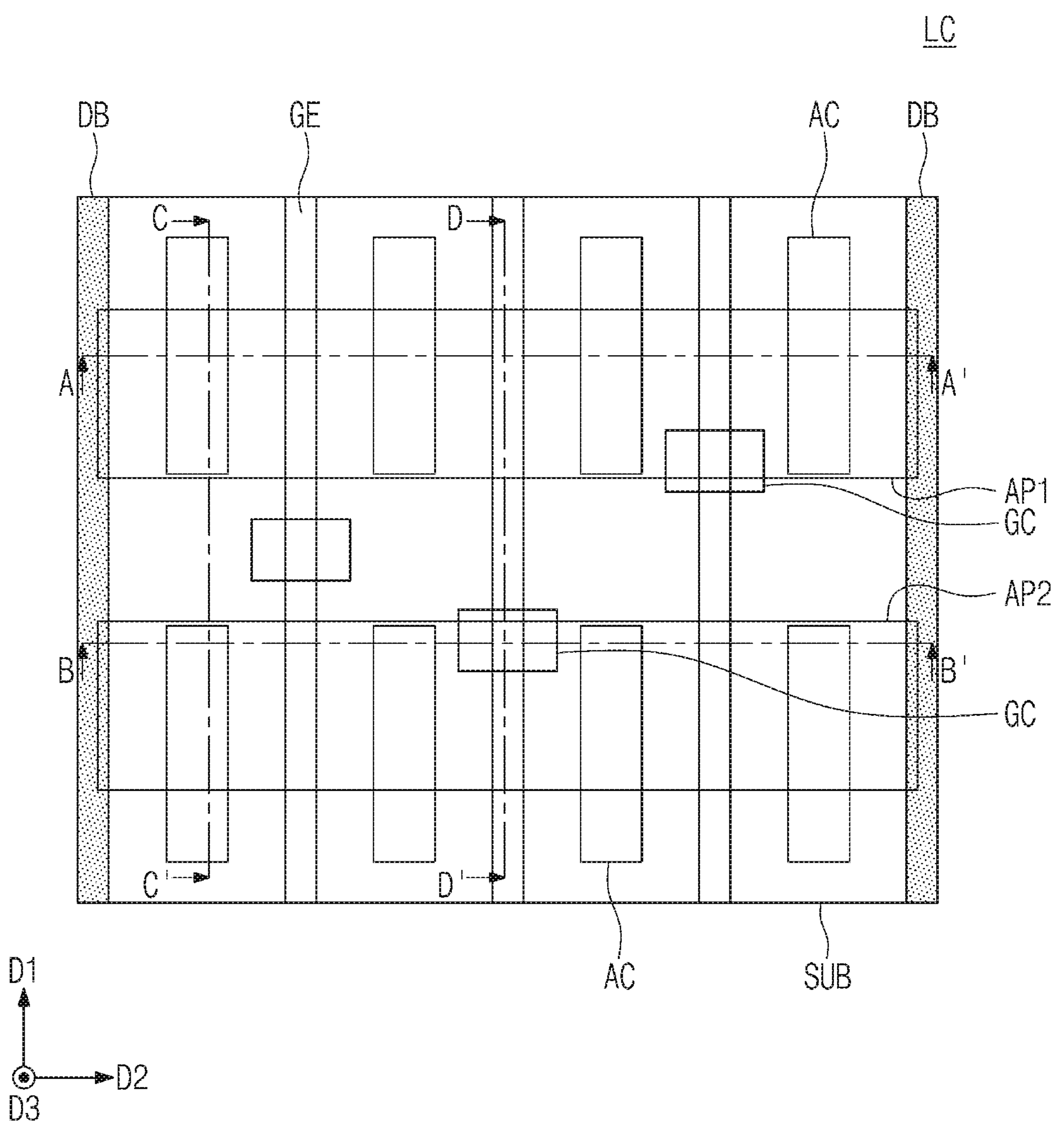
FIG. 29 and FIG. 31 illustrate plan views showing a method of fabricating a semiconductor device according to some embodiments of the present inventive concepts.
Figure 30A:
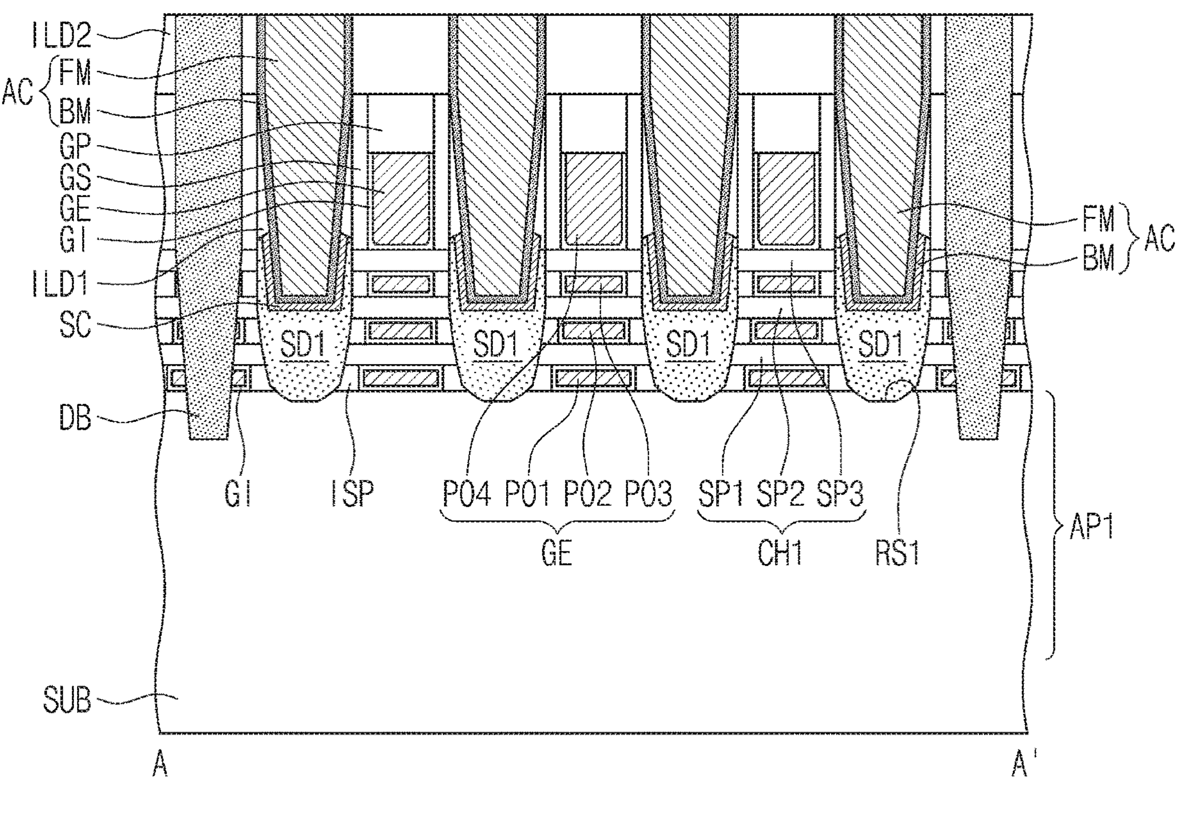
FIGS. 30A, 30B, 30C, and 30D illustrate cross-sectional views respectively taken along lines A-A', B-B', C-C', and D-D' of FIG. 29.
Figure 30B:
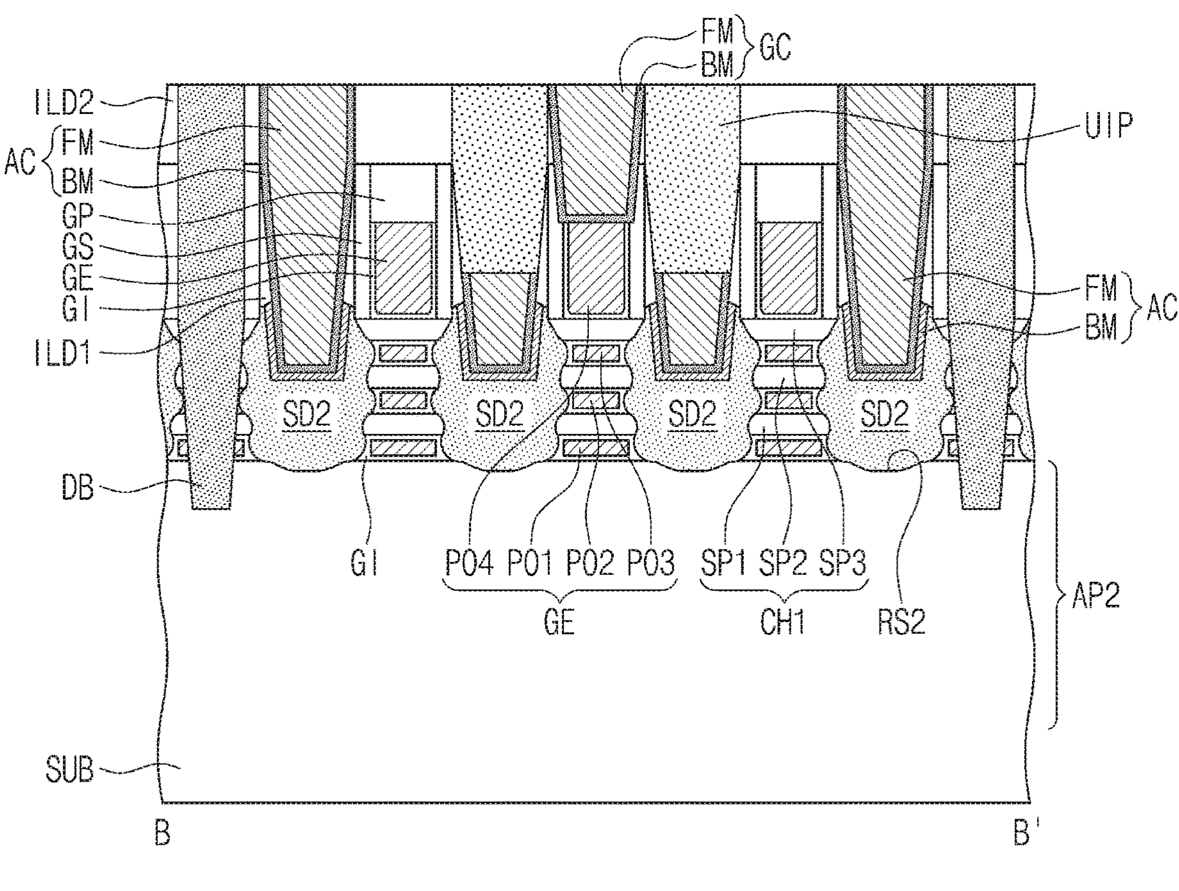
Figure 30C:
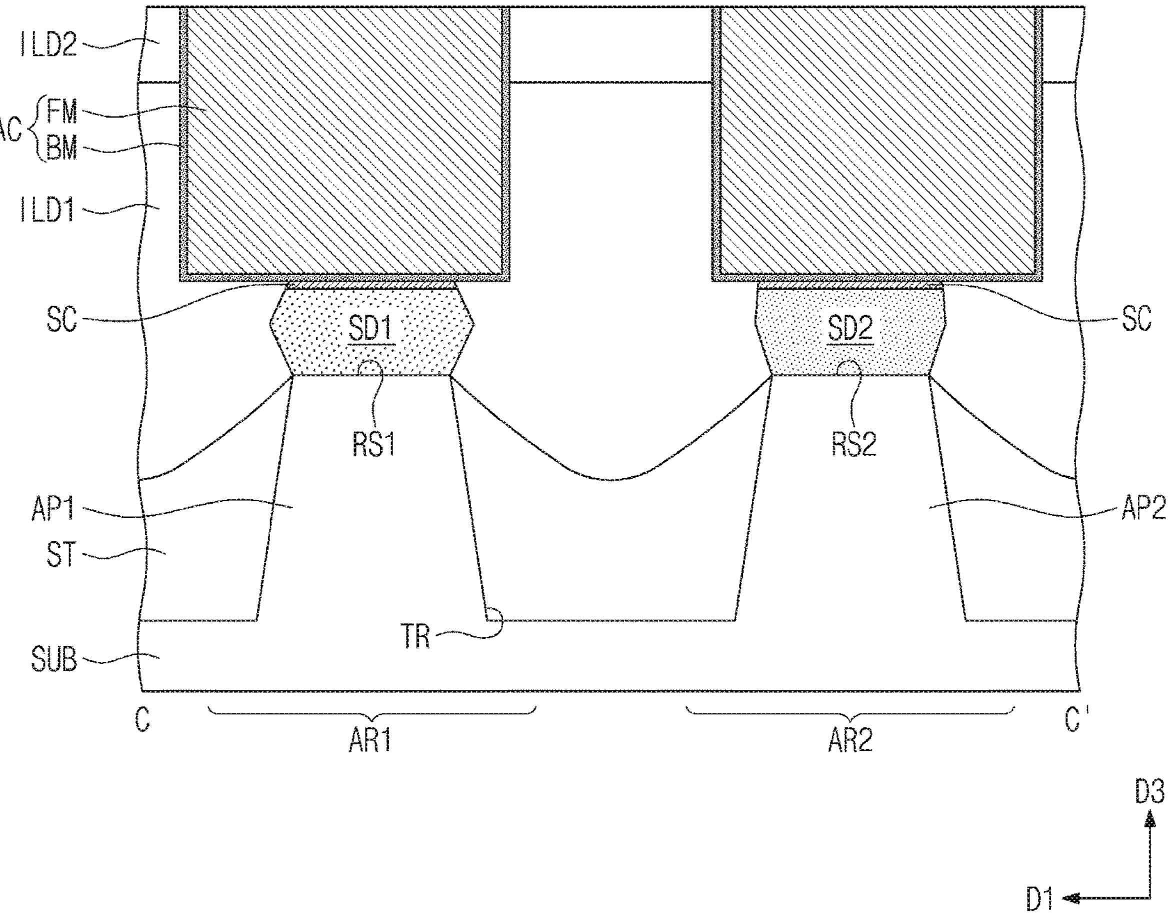
Figure 30D:
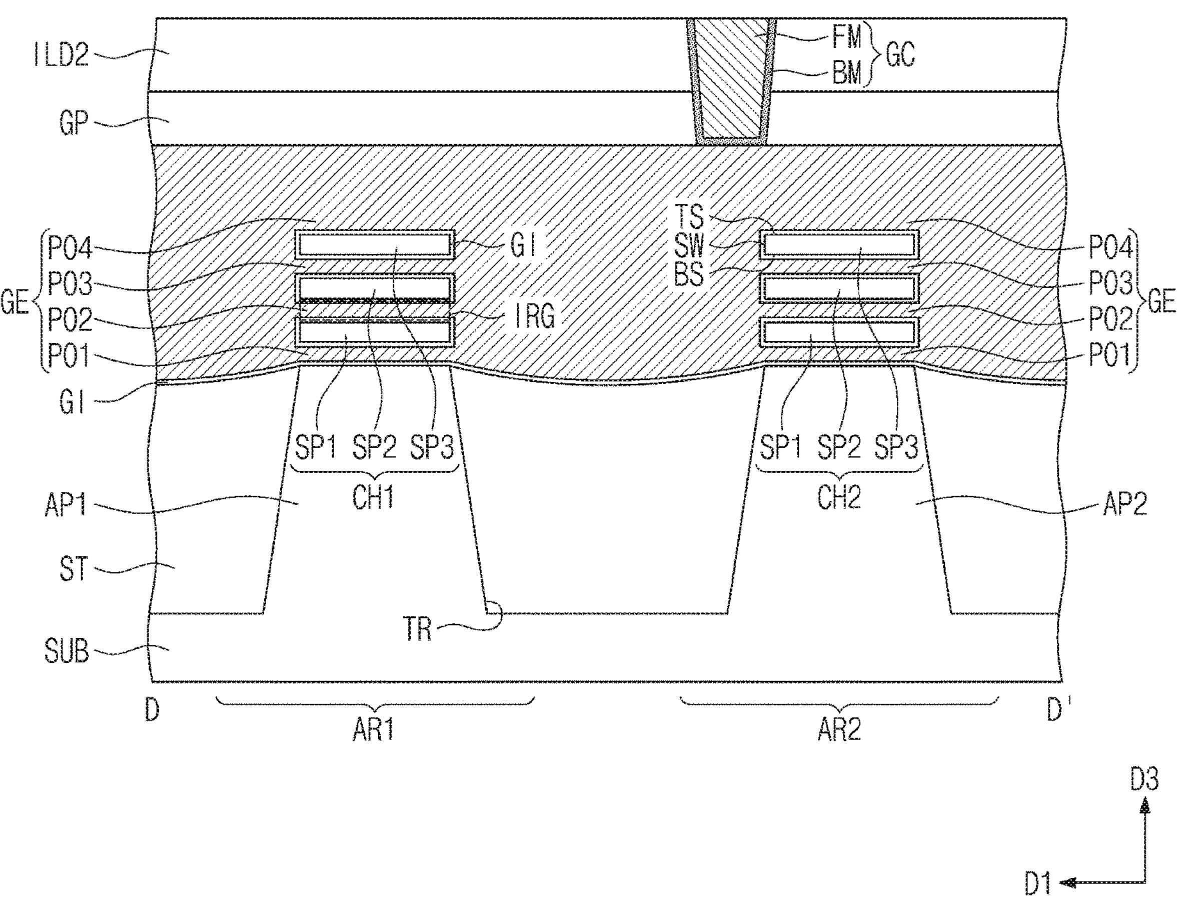
Figure 31:
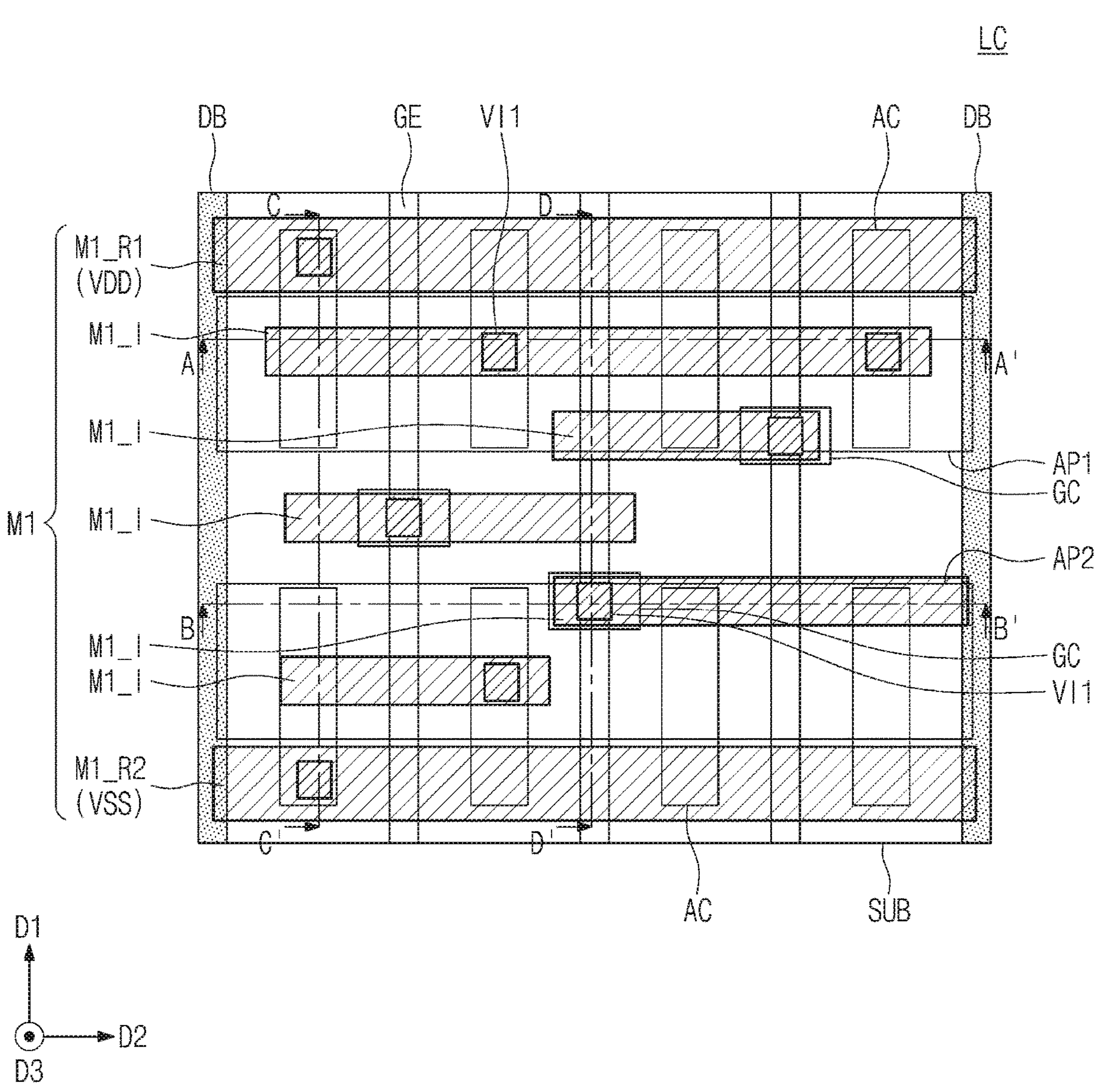
Figure 32A:
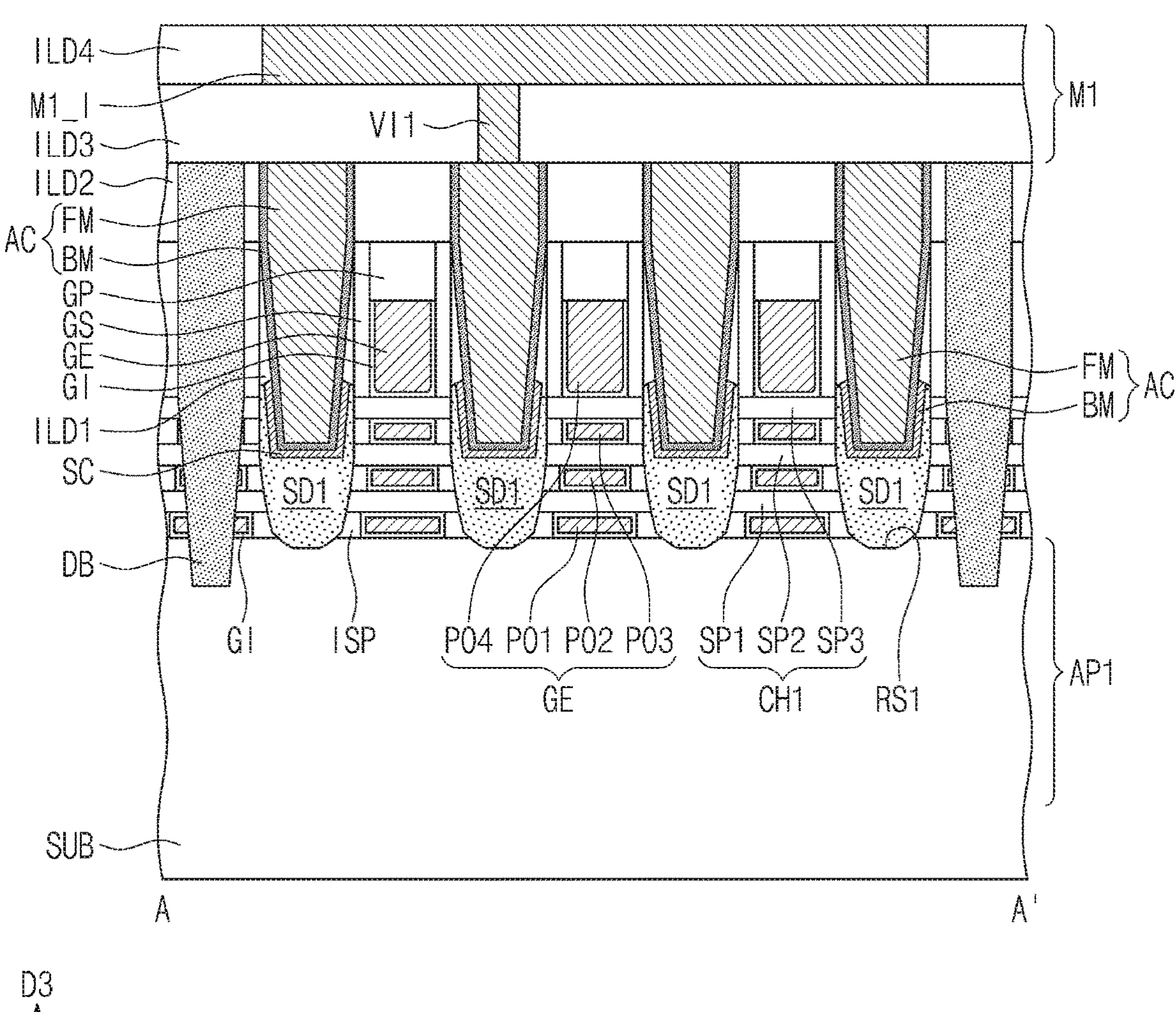
FIGS. 32A, 32B, 32C, and 32D illustrate cross-sectional views respectively taken along lines A-A', B-B', C-C', and D-D' of FIG. 31.
Figure 32B:
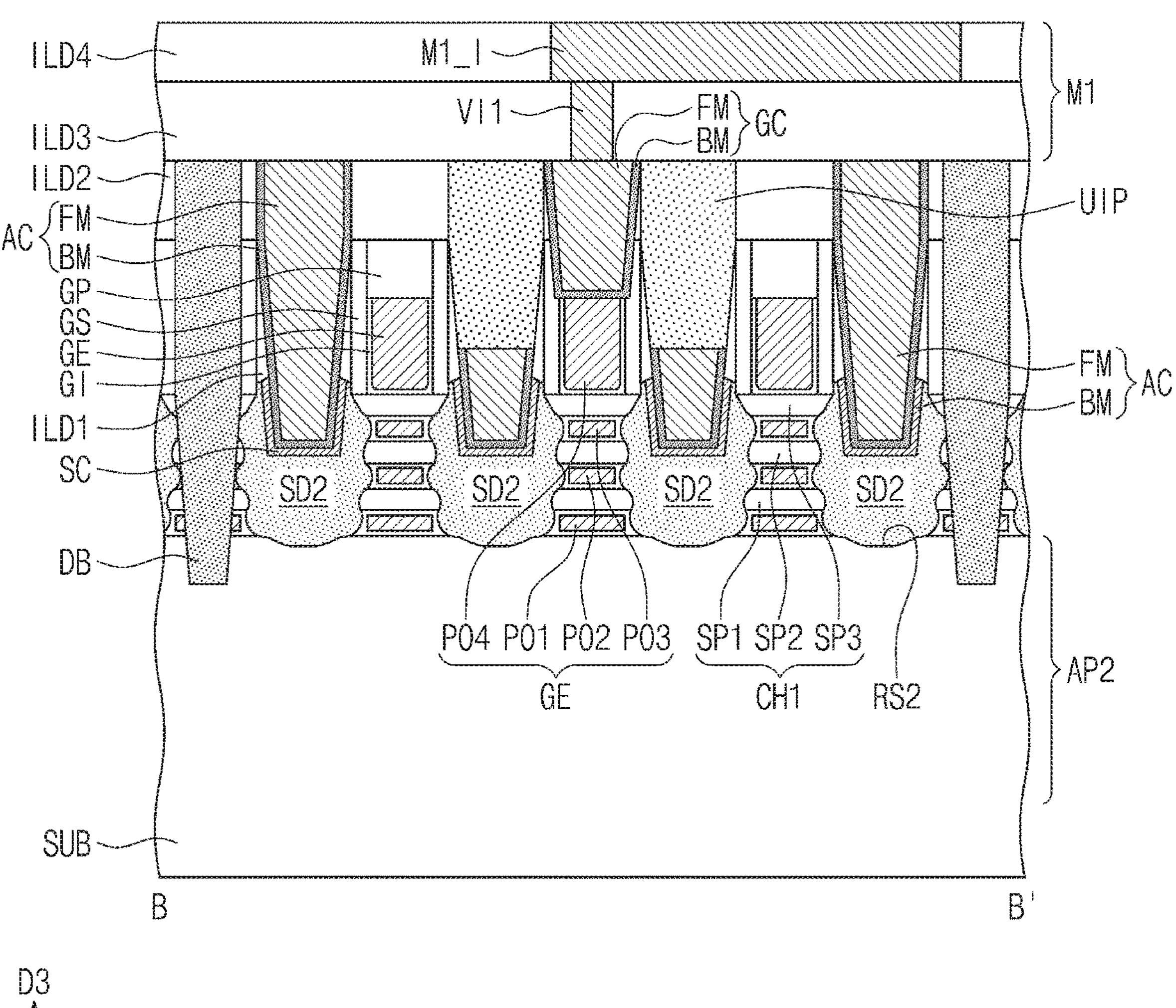
Figure 32C:
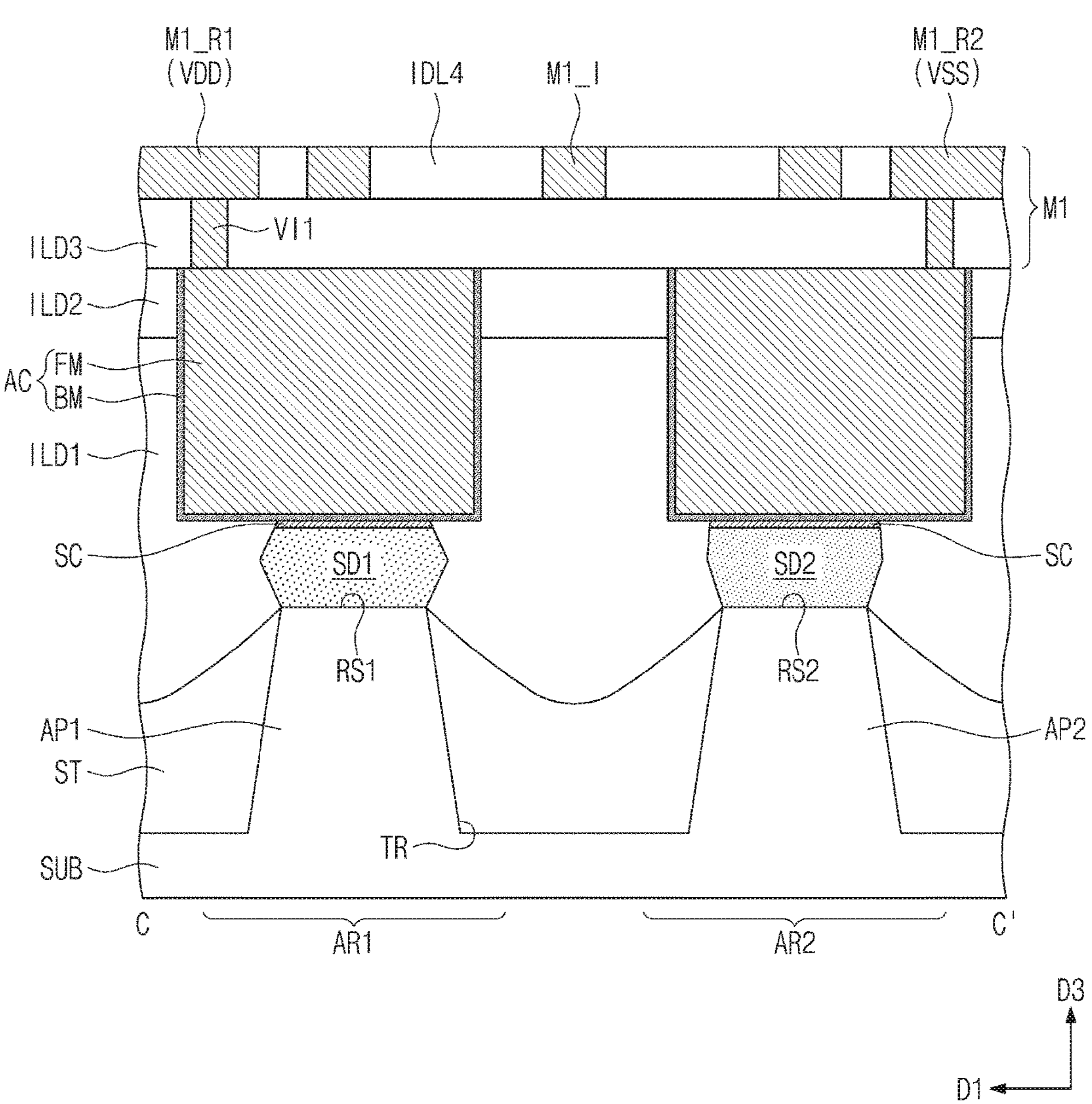
Figure 32D:
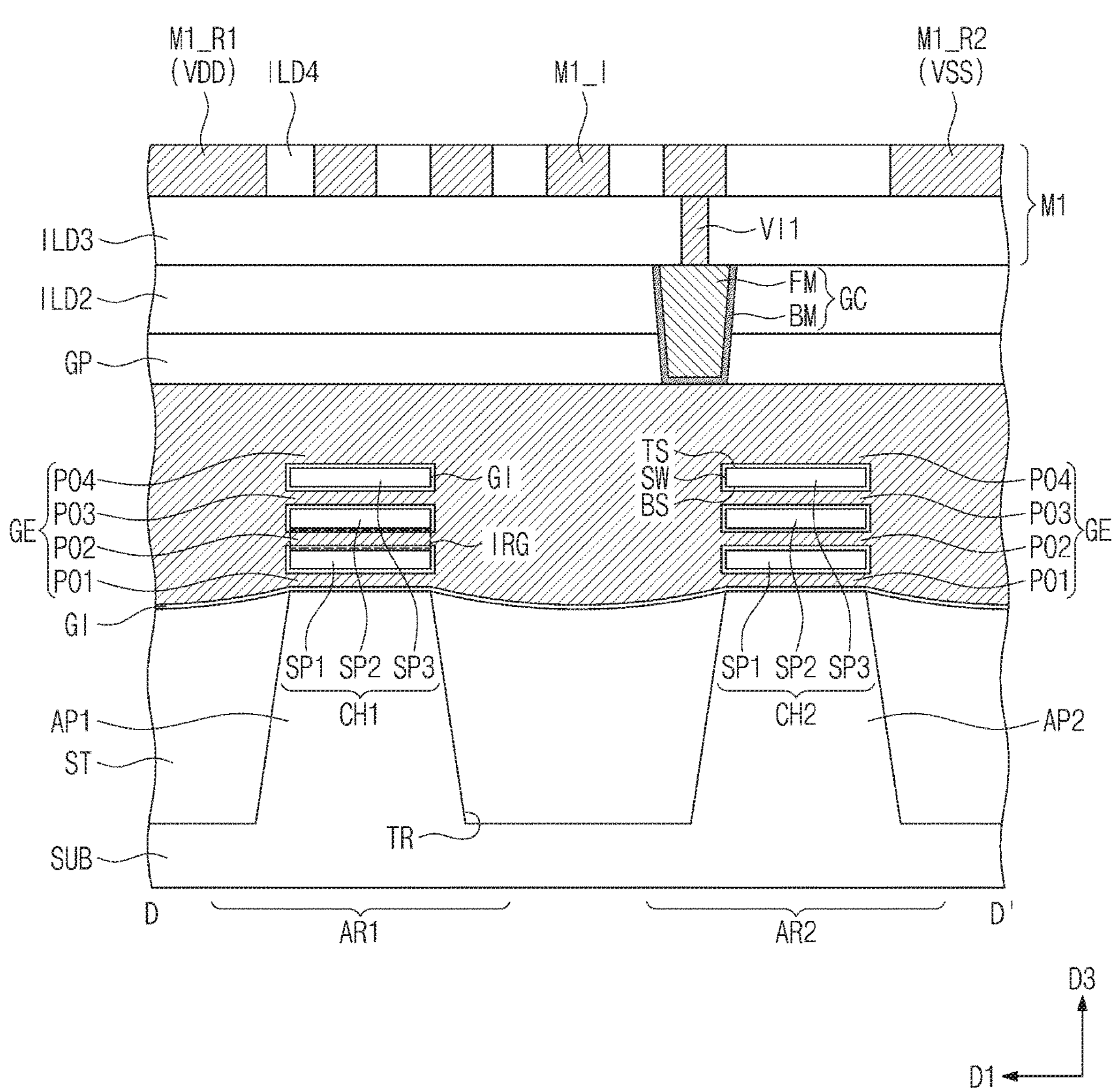

FIG. 29, FIG. 30, and FIG. 31 illustrate plan views showing a method of fabricating a semiconductor device according to some embodiments of the present inventive concepts. FIG. 30A, FIG. 30B, FIG. 30C, and FIG. 30D illustrate cross-sectional views respectively taken along lines A-A', B-B', C-C', and D-D' of FIG. 29. FIG. 32A, FIG. 32B, FIG. 32C, and FIG. 32D illustrate cross-sectional views respectively taken along lines A-A', B-B', C-C', and D-D' of FIG. 31.

Referring to FIG. 29, FIG. 30A, and FIG. 30B, a logic cell LC may be provided on a substrate SUB. The logic cell LC may include logic transistors included in a logic circuit.

A first active pattern AP1 and a second active pattern AP2 may be formed on an upper portion of the substrate SUB. In some embodiment of the present inventive concepts, the first active pattern AP1 may be an NMOSFET region, and the second active pattern AP2 may be a PMOSFET region. The substrate SUB may be, for example, a compound semiconductor substrate or a semiconductor substrate including silicon, germanium, or silicon-germanium. For example, the substrate SUB may be a silicon substrate.

The formation of the first active pattern AP1 and the second active pattern AP2 may include forming a trench TR that defines the first active pattern AP1 and the second active pattern AP2 on the upper portion of the substrate SUB. The first active pattern AP1 and the second active pattern AP2 may be spaced apart from each other in a first direction D1 across the trench TR. The first active pattern AP1 and the second active pattern AP2 may each have a linear shape that extends in a second direction D2 intersecting the first direction D1. A device isolation layer ST may be formed to fill the trench TR. The device isolation layer ST may include a silicon oxide layer.

The first active pattern AP1 and the second active pattern AP2 may be line-and-space patterns. The formation of the first active pattern AP1 and the second active pattern AP2 may include forming a hardmask layer on the substrate SUB, forming a plurality of linear photoresist patterns on the hardmask layer, using the photoresist patterns as an etching mask to pattern the hardmask layer, and using the patterned hardmask layer as an etching mask to etch the substrate SUB. The photoresist patterns may be formed by using the photolithography process according to some embodiments of the present inventive concepts discussed with above with reference to FIG. 7 and FIG. 8. A photomask for forming the first active pattern AP1 and the second active pattern AP2 may be manufactured through the optical proximity correction (OPC) step S30 described with reference to FIGS. 9 to 24 according to some embodiments of the present inventive concepts.

First channel patterns CH1 and first source/drain patterns SD1 may be formed on the first active pattern AP1. Each of the first channel patterns CH1 may include a first semiconductor pattern SP1, a second semiconductor pattern SP2, and a third semiconductor pattern SP3. The first semiconductor pattern SP1, the second semiconductor pattern SP2, and the third semiconductor pattern SP3 may be sequentially stacked. The first, second, and third semiconductor patterns SP1, SP2, and SP3 may be spaced apart from each other in a vertical direction (or a third direction D3).

Each of the first source/drain patterns SD1 may include an impurity region having a first conductivity type (e.g., n-type). The first source/drain patterns SD1 may be epitaxial patterns formed by a selective epitaxial growth process. For example, the first source/drain patterns SD1 may include the same semiconductor element (e.g., Si) as that of the substrate SUB.

Second channel patterns CH2 and second source/drain patterns SD2 may be formed on the second active pattern AP2. Each of the second channel patterns CH2 may include a first semiconductor pattern SP1, a second semiconductor pattern SP2, and a third semiconductor pattern SP3, which may be sequentially stacked. The first, second, and third semiconductor patterns SP1, SP2, and SP3 may be spaced apart from each other in the third direction D3.

Each of the second source/drain patterns SD2 may include an impurity region having a second conductivity type (e.g., p-type). The second source/drain patterns SD2 may be epitaxial patterns formed by a selective epitaxial growth process. The second source/drain pattern SD2 may include a semiconductor element (e.g., SiGe) whose lattice constant is greater than that of a semiconductor element of the substrate SUB. As a result, the second source/drain patterns SD2 may provide the second channel pattern CH2 with compressive stress.

Gate electrodes GE may be formed to extend in the first direction D1 across the first active pattern AP1 and the second active pattern AP2. The gate electrodes GE may be arranged at a regular pitch along the second direction D2. The gate electrode GE may vertically overlap the first channel pattern CH1 and the second channel pattern CH2.

The gate electrodes GE may be line-and-space patterns. The formation of the gate electrodes GE may use a photolithography process for forming a line-and-space pattern described according to some embodiments of the present inventive concepts. For example, a photomask for forming the gate electrodes GE may be manufactured by the OPC step S30 described with reference to FIGS. 9 to 24 according to the present inventive concepts.

The gate electrode GE may include a first inner electrode PO1 interposed between the first semiconductor pattern SP1 and the first active pattern AP1 or the second active pattern AP2, a second inner electrode PO2 interposed between the first semiconductor pattern SP1 and the second semiconductor pattern SP2, a third inner electrode PO3 interposed between the second semiconductor pattern SP2 and the third semiconductor pattern SP3, and an outer electrode PO4 on the third semiconductor pattern SP3.

The gate electrode GE may surround a top surface TS, a bottom surface BS, and opposite sidewalls SW of each of the first semiconductor pattern SP1, the second semiconductor pattern SP2, and the third semiconductor pattern SP3. For example, a transistor according to some embodiments of the present embodiment may be a three-dimensional field effect transistor (e.g., MBCFET or GAAFET) in which the gate electrode GE three-dimensionally surrounds the first channel pattern CH1 and the second channel pattern CH2.

A pair of gate spacers GS may be formed on opposite sidewalls of each of the gate electrodes GE. The gate spacer GS may extend in the first direction D1 along the gate electrode GE. The gate spacer GS may have a top surface higher than that of the gate electrode GE. The top surface of the gate spacer GS may be coplanar with that of a first interlayer dielectric layer ILD1 as described herein. The gate spacer GS may include at least one of SiCN, SiCON, or SiN. In some embodiments, the gate spacer GS may include multiple layers formed of at least two of SiCN, SiCON, or SiN.

A gate capping pattern GP may be formed on each of the gate electrodes GE. The gate capping pattern GP may extend in the first direction D1 along the gate electrode GE. The gate capping pattern GP may include a material having an etch selectivity with respect to first interlayer dielectric layers ILD1 and the second interlayer dielectric layer ILD2, which will be described herein. For example, the gate capping pattern GP may include at least one of SiON, SiCN, SiCON, or SiN.

A gate dielectric layer GI may be formed between the gate electrode GE and the first channel pattern CH1, and between the gate electrode GE and the second channel pattern CH2. The gate dielectric layer GI may cover the top surface TS, the bottom surface BS, and the opposite sidewalls SW of each of the first, second, and third semiconductor patterns SP1, SP2, and SP3 (see FIG. 30D).

In some embodiments of the present inventive concepts, the gate dielectric layer GI may include a high-k dielectric material whose dielectric constant is greater than that of a silicon oxide layer. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The gate electrode GE may include a first metal pattern and a second metal pattern on the first metal pattern. The first metal pattern may be provided on the gate dielectric layer GI to constitute the first inner electrode PO1, the second inner electrode PO2, and the third inner electrode PO3. The first metal pattern may include a work-function metal that controls a threshold voltage of a transistor. A thickness and composition of the first metal pattern may be adjusted to achieve a desired threshold voltage.

The first metal pattern may include a metal nitride layer. For example, the first metal pattern may include nitrogen (N) and a metal such as titanium (Ti), tantalum (Ta), aluminum (Al), tungsten (W), or molybdenum (Mo), or a combination thereof. The first metal pattern may further include carbon (C). The first metal pattern may include a plurality of stacked work-function metal layers.

The outer electrode PO4 may include a first metal pattern and a second metal pattern. The second metal pattern may include a metal whose resistance is less than that of the first metal pattern. For example, the second metal pattern may include tungsten (W), aluminum (Al), titanium (Ti), or tantalum (Ta), or a combination thereof.

A first interlayer dielectric layer ILD1 may be formed on the substrate SUB. The first interlayer dielectric layer ILD1 may be formed to cover the gate spacers GS, the first source/drain patterns SD1, and the second source/drain pattern SD2. The first interlayer dielectric layer ILD1 may have a top surface substantially coplanar with those of the gate capping patterns GP and those of the gate spacers GS. A second interlayer dielectric layer ILD2 may be provided on the first interlayer dielectric layer ILD1 and covering the gate capping patterns GP.

As shown in FIG. 29, a pair of separation structures DB may be formed to face each other in the second direction D2 on opposite sides of the logic cell LC. The separation structures DB may extend in the first direction D1 parallel to the gate electrodes GE. The separation structures DB may penetrate the first interlayer dielectric layer ILD1 and the second interlayer dielectric layer ILD2 to extend into the first active pattern AP1 and the second active pattern AP2. The separation structures DB may penetrate an upper portion of each of the first active pattern AP1 and the second active pattern AP2. The separation structures DB may separate an active pattern of the logic cell LC from an active pattern of another logic cell adjacent the logic cell LC.

Active contacts AC may be formed to penetrate the first interlayer dielectric layers ILD1 and the second interlayer dielectric layer ILD2 to come into electrical connection with the first source/drain pattern SD1 and the second source/drain pattern SD2. Each of the active contacts AC may be provided between a pair of gate electrodes GE.

The active contact AC may be a self-aligned contact. For example, the gate capping pattern GP and the gate spacer GS may be used to form the active contact AC in a self-aligned manner. The active contact AC may cover, for example, at least a portion of a sidewall of the gate spacer GS. Although not shown, the active contact AC may cover a portion of the top surface of the gate capping pattern GP.

The formation of the active contacts AC may include patterning an etch target layer. For example, the formation of the active contacts AC may include patterning the first interlayer dielectric layer ILD1 and the second interlayer dielectric layer ILD2 to form contact holes, and filling the contact holes with a conductive material.

The active contacts AC may be line-and-space patterns. The formation of the active contacts AC, or the contact holes, may use a photolithography process for forming a line-and-space pattern described herein according to some embodiments of the present inventive concepts. For example, a photomask for forming the active contacts AC may be manufactured through the OPC step S30 described herein with reference to FIGS. 9 to 24 according to some embodiments the present inventive concepts.

A silicide pattern SC may be formed between the active contact AC and the first source/drain pattern SD1, and between the active contact AC and the second source/drain pattern SD2. The active contact AC may be electrically connected through the silicide pattern SC to one of the first source/drain pattern SD1 and the second source/drain pattern SD2. The silicide pattern SC may include a metal silicide including, for example, at least one of titanium silicide, tantalum silicide, tungsten silicide, nickel silicide, or cobalt silicide.

A gate contact GC may be formed to penetrate the second interlayer dielectric layer ILD2 and the gate capping pattern GP, and make an electrical connection with the gate electrode GE. For example, referring to FIG. 30B, the active contact AC may have an upper portion adjacent to the gate contact GC, and an upper dielectric pattern UIP may be formed on the upper portion of the active contact AC. Therefore, it may be possible to prevent an electrical short caused by contact between the gate contact GC and its adjacent active contact AC.

Each of the active contact AC and the gate contact GC may include a conductive pattern FM and a barrier pattern BM that surrounds the conductive pattern FM. For example, the conductive pattern FM may include a metal such as aluminum, copper, tungsten, molybdenum, or cobalt, or a combination thereof. The barrier pattern BM may cover sidewalls and a bottom surface of the conductive pattern FM. The barrier pattern BM may include a metal layer and a metal nitride layer. The metal layer may include at least one of titanium, tantalum, tungsten, nickel, cobalt, or platinum. The metal nitride layer may include at least one of a titanium nitride (TiN) layer, a tantalum nitride (TaN) layer, a tungsten nitride (WN) layer, a nickel nitride (NiN) layer, a cobalt nitride (CON) layer, or a platinum nitride (PtN) layer.

Referring to FIG. 31, FIG. 32A, FIG. 32B, FIG. 32C, and FIG. 32D, a third interlayer dielectric layer ILD3 may be formed on the second interlayer dielectric layer ILD2. First vias VI1 may be formed in the third interlayer dielectric layer ILD3. A fourth interlayer dielectric layer ILD4 may be formed on the third interlayer dielectric layer ILD3. Wiring lines M1_R1, M1_R2, and M1_I may be formed in the fourth interlayer dielectric layer ILD4. The wiring lines M1_R1, M1_R2, and M1_I may include a first power line M1_R1, a second power line M1_R2, and lower lines M1_I.

Referring to FIG. 31, the first power line M1_R1 and the second power line M1_R2 may each extend in the second direction D2 while extending across the logic cell LC. The lower lines M1_I may be disposed between the first power lines M1_R1 and the second power lines M1_R2. The lower lines M1_I may each have a linear or bar shape that extends in the second direction D2.

A first metal layer M1 may be constituted by the wiring lines M1_R1, M1_R2, and M1_I and the first vias VI1 thereunder. The first via VI1 may be interposed between, and electrically connect to, a wiring line and one of the active contact AC or the gate contact GC. Although not shown, metal layers M2, M3, M4, etc. may be additionally formed on the first metal layer M1.

The wiring lines M1_R1, M1_R2, and M1_I may be line-and-space patterns. The formation of the wiring lines M1_R1, M1_R2, and M1_I may use a photolithography process for forming a line-and-space pattern described herein. For example, a photomask for forming the wiring lines M1_R1, M1_R2, and M1_I may be manufactured through the OPC step S30 described herein with reference to FIGS. 9 to 24 according to some embodiments of the present inventive concepts.

An optical proximity correction (OPC) method according to some embodiments of the present inventive concepts may produce the same hash value for segments having a same surrounding environment for purposes of providing a correction bias. Therefore, the same correction bias may be applied to the segments having the same surrounding environment. In conclusion, some embodiments of the present inventive concepts may maintain a consistency of optical proximity correction (OPC), increase an accuracy of OPC, and reduce an OPC execution time.

Although some embodiments of inventive concepts have been described with reference to accompanying figures, it will be understood that various changes in form and details may be made therein without departing from the spirit and scope of inventive concepts. It therefore will be understood that embodiments described herein are illustrative and not limiting in aspects.

What is claimed is:

1. A method of fabricating a photomask, the method comprising:

performing an optical proximity correction (OPC) on a design pattern to generate a correction pattern; and manufacturing the photomask having the correction pattern, wherein performing the OPC includes:

dividing the design pattern into a plurality of segments;

producing a hash value for each of the plurality of segments; and generating the correction pattern by applying a first correction bias to ones of the plurality of segments having a same hash value, wherein at least two of the plurality of segments have the same hash value, wherein producing the hash value includes:

generating a key segment in a target segment;

creating a query region around the key segment; and producing the hash value for the target segment based on a pattern image in the query region.

2. The method of claim 1, wherein the design pattern is a line-and-space pattern.

3. The method of claim 1, wherein the key segment is generated having a length on a center of the target segment.

4. The method of claim 3, wherein the key segment has a length of 1 database unit (DBU) or 2 DBU.

5. The method of claim 1, wherein the key segment is generated around an end of the target segment.

6. The method of claim 1, wherein the hash value is generated based on first information about a length and a direction of the key segment and second information about the pattern image around the key segment.

7. The method of claim 1, wherein the plurality of segments includes a normal segment and an abnormal segment that has a length different than a length of the normal segment, wherein the pattern image around the normal segment is the same as the pattern image around the abnormal segment, and wherein a first hash value of the normal segment is the same as a second hash value of the abnormal segment.

8. The method of claim 7, wherein generating the correction pattern includes:

applying the first correction bias to the normal segment; and applying the first correction bias to the abnormal segment.

9. The method of claim 1, wherein performing the OPC further includes performing a mask rule check on the correction pattern.

10. The method of claim 1, further comprising:

forming a photoresist pattern on a substrate by using the photomask having the correction pattern;

forming a plurality of transistors on the substrate;

forming an interlayer dielectric layer on the transistors; and forming wiring lines in the interlayer dielectric layer, wherein the photoresist pattern is used as an etching mask for forming the wiring lines.

11. A method of fabricating a photomask, the method comprising:

performing an optical proximity correction (OPC) on a line-and-space pattern to generate a correction pattern; and manufacturing the photomask having the correction pattern, wherein performing the OPC includes:

dividing the line-and-space pattern into a plurality of segments;

producing a hash value for each of the plurality of segments; and generating the correction pattern by applying a first correction bias to ones of the plurality of segments having a same hash value, wherein at least two of the plurality of segments have the same hash value, wherein producing the hash value includes producing the same hash value for at least two segments of the plurality of segments that have a same pattern image in a query region.

12. The method of claim 11, wherein producing the hash value further includes generating a key segment for a target segment, wherein the query region is created around the key segment.

13. The method of claim 12, wherein the key segment is generated having a length on a center of the target segment.

14. The method of claim 11, wherein the plurality of segments includes a normal segment and an abnormal segment that has a length different than a length of the normal segment, wherein a first pattern image in a first query region of the normal segment is the same as a second pattern image in a second query region of the abnormal segment, and wherein a first hash value of the normal segment is the same as a second hash value of the abnormal segment.

15. The method of claim 14, wherein generating the correction pattern includes:

applying the first correction bias to the normal segment; and applying the first correction bias to the abnormal segment.

16. A method of fabricating a semiconductor device, the method comprising:

performing an optical proximity correction (OPC) on a design pattern to generate a correction pattern;

using the correction pattern to manufacture a photomask;
forming an etch target layer and a photoresist layer on a substrate;
using the photomask to expose and develop the photoresist layer to form a plurality of photoresist patterns; and
using the plurality of photoresist patterns to pattern the etch target layer,
wherein performing the OPC includes:
dividing the design pattern into a plurality of segments including a normal segment and an abnormal segment that has a length different than a length of the normal segment;
creating a first query region of the normal segment;
creating a second query region of the abnormal segment, the second query region having a pattern image the same as a pattern image of the first query region;
producing a same hash value for the normal segment and the abnormal segment; and
generating the correction pattern by applying a same correction bias to the normal segment and the abnormal segment that have the same hash value.

17. The method of claim 16, wherein performing the OPC further includes:
generating a first key segment in the normal segment; and
generating a second key segment in the abnormal segment,
wherein the first key segment and the second key segment have a same length,
wherein the first query region is created around the first key segment, and
wherein the second query region is created around the second key segment.

18. The method of claim 17, wherein the first key segment has a length of 1 database unit (DBU) or 2 DBU and the second key segment has a length of 1 DBU or 2 DBU.

19. The method of claim 16, wherein performing the OPC further includes performing a mask rule check on the correction pattern.

20. The method of claim 16, further comprising:
forming a plurality of transistors on the substrate;
forming an interlayer dielectric layer on the transistors; and
forming wiring lines in the interlayer dielectric layer,
wherein the etch target layer includes the interlayer dielectric layer, and
wherein the plurality of photoresist patterns are used as an etching mask for forming the wiring lines.

* * * * *